(12) United States Patent
Yamashita et al.

(10) Patent No.: US 11,240,455 B2
(45) Date of Patent: Feb. 1, 2022

(54) AD CONVERSION DEVICE, AD CONVERSION METHOD, IMAGE SENSOR, AND ELECTRONIC APPARATUS

(71) Applicant: SONY SEMICONDUCTOR SOLUTIONS CORPORATION, Kanagawa (JP)

(72) Inventors: Tomonori Yamashita, Kanagawa (JP); Yosuke Ueno, Kanagawa (JP); Atsumi Niwa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 405 days.

(21) Appl. No.: 16/319,181

(22) PCT Filed: Jul. 14, 2017

(86) PCT No.: PCT/JP2017/025658
§ 371 (c)(1),
(2) Date: Jan. 18, 2019

(87) PCT Pub. No.: WO2018/021055
PCT Pub. Date: Feb. 1, 2018

(65) Prior Publication Data
US 2021/0185256 A1 Jun. 17, 2021

(30) Foreign Application Priority Data
Jul. 28, 2016 (JP) .............................. JP2016-148566

(51) Int. Cl.
*H04N 5/378* (2011.01)
*H03M 1/56* (2006.01)
*H04N 5/3745* (2011.01)

(52) U.S. Cl.
CPC .............. *H04N 5/378* (2013.01); *H03M 1/56* (2013.01); *H04N 5/37455* (2013.01)

(58) Field of Classification Search
CPC ...................................................... H04N 5/378
(Continued)

(56) References Cited

U.S. PATENT DOCUMENTS

| 2010/0091167 A1 | 4/2010 | Azami |
| 2014/0048685 A1 | 2/2014 | Zhang et al. |

(Continued)

FOREIGN PATENT DOCUMENTS

| EP | 2555509 | | 2/2013 | |
| EP | 2555509 | * | 6/2013 | ............. H04N 5/378 |

(Continued)

OTHER PUBLICATIONS

Extended European Search Report for European Patent Application No. 17834063.4, dated Jul. 4, 2019, 7 pages.
(Continued)

*Primary Examiner* — Joel W Fosselman
(74) *Attorney, Agent, or Firm* — Sheridan Ross P.C.

(57) ABSTRACT

The present technology relates to an AD conversion device, an AD conversion method, an image sensor, and an electronic apparatus that are able to achieve high-speed, low-power-consumption AD conversion. In a case where an electrical signal and a variable-level reference signal are compared by a comparator and the result of comparison is used to perform AD (Analog to Digital) conversion of the electrical signal, control is exercised in such a manner that a bias current flowing in the comparator to operate the comparator during a certain section of the reference signal including a section where the reference signal changes is increased from a first current, which is larger than 0 (zero), to a second current, which is larger than the first current. The present technology is applicable, for example, to AD conversion of an electrical signal.

7 Claims, 14 Drawing Sheets

(58) Field of Classification Search
USPC .......................................................... 348/294
See application file for complete search history.

(56) References Cited

U.S. PATENT DOCUMENTS

2014/0361916 A1   12/2014  Wolfs
2015/0187335 A1    7/2015  Sugiyama et al.

FOREIGN PATENT DOCUMENTS

| JP | H11-355387 | 12/1999 |
|----|------------|---------|
| JP | 2008-187565 | 8/2008 |
| JP | 2009-124513 | 6/2009 |
| JP | 2010-093641 | 4/2010 |
| JP | 2013-038549 | 2/2013 |
| JP | 2015-156454 | 8/2015 |
| JP | 2015-126454 | 7/2016 |
| WO | WO 2016/076139 | 5/2016 |

OTHER PUBLICATIONS

Official Action (no English translation available) for Japanese Patent Application No. 2018-529772, dated Dec. 1, 2020, 5 pages.
International Search Report prepared by the Japan Patent Office dated Sep. 22, 2017, for International Application No. PCT/JP2017/025658.

\* cited by examiner

F I G . 6
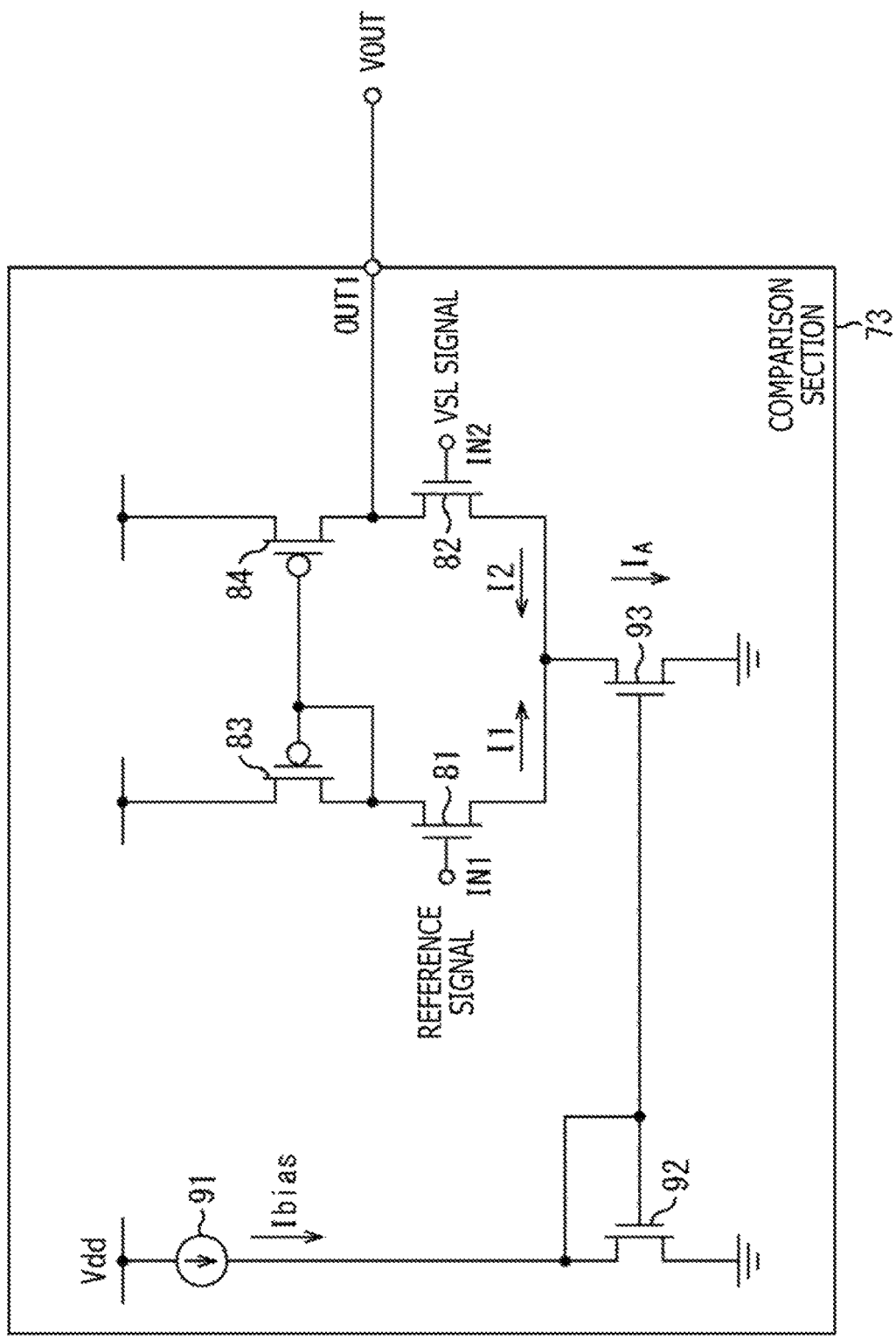

AD CONVERSION DEVICE, AD CONVERSION METHOD, IMAGE SENSOR, AND ELECTRONIC APPARATUS

CROSS REFERENCE TO RELATED APPLICATIONS

This application is a national stage application under 35 U.S.C. 371 and claims the benefit of PCT Application No. PCT/JP2017/025658 having an international filing date of 14 Jul. 2017, which designated the United States, which PCT application claimed the benefit of Japanese Patent Application No. 2016-148566 filed 28 Jul. 2016, the entire disclosures of each of which are incorporated herein by reference.

TECHNICAL FIELD

The present technology relates to an AD conversion device, an AD conversion method, an image sensor, and an electronic apparatus, and more specifically relates to an AD conversion device, an AD conversion method, an image sensor, and an electronic apparatus that are able, for example, to achieve high-speed, low-power-consumption AD conversion.

BACKGROUND ART

In recent years, digital (still/video) cameras and other electronic apparatuses use, for example, a CMOS (Complementary Metal Oxide Semiconductor) image sensor as a solid-state imaging device for capturing images.

In the CMOS image sensor, an ADC (Analog to Digital Converter) compares, for example, an electrical signal obtained from a pixel with a variable-level reference signal, and subjects the electrical signal obtained from the pixel to AD (Analog to Digital) conversion by using the result of comparison between the electrical signal and the reference signal.

For example, a column-parallel AD conversion method is available as the AD conversion method adopted by the CMOS image sensor. The column-parallel AD conversion method parallelly performs AD conversion of electrical signals obtained from a plurality of pixels such as pixels in a horizontal line.

As a method of achieving low-power-consumption AD conversion in the above-described CMOS image sensor, control is exercised in such a manner that a current source included in a comparator included in the ADC to compare the electrical signal obtained from a pixel with the reference signal is turned off to intermittently operate the comparator (refer, for example, to PTL 1).

CITATION LIST

Patent Literature

[PTL 1]
Japanese Patent Laid-open No. 2009-124513

SUMMARY

Technical Problem

In a case where the comparator is to be intermittently operated by exercising control to turn off the current source included in the comparator, it takes a considerable amount of time for the comparator to become operative when the status of the current source is changed from OFF to ON. This increases response time and makes it difficult to achieve high-speed AD conversion.

Meanwhile, high-speed AD conversion can be achieved by allowing a large current to flow into the current source included in the comparator. However, power consumption increases if a large current constantly flows into the current source included in the comparator.

Further, high-speed, low-power-consumption AD conversion is demanded not only in the CMOS image sensor but also in various technical fields.

In view of the above circumstances, the present technology has been made to achieve high-speed, low-power-consumption AD conversion.

Solution to Problem

An AD conversion device according to the present technology includes an AD conversion section and a control section. The AD conversion section includes a comparator for comparing an electrical signal with a variable-level reference signal, and performs AD (Analog to Digital) conversion of the electrical signal by using the result of comparison made by the comparator between the electrical signal and the reference signal. The control section exercises control in such a manner that a bias current flowing in the comparator to operate the comparator during a certain section of the reference signal including a section where the reference signal changes is increased from a first current to a second current. The first current is larger than 0 (zero). The second current is larger than the first current.

An AD conversion method according to the present technology includes a step of: in a case where the result of comparison made by a comparator comparing an electrical signal with a variable-level reference signal is used to perform AD (Analog to Digital) conversion of the electrical signal, exercising control in such a manner that a bias current flowing in the comparator to operate the comparator during a certain section of the reference signal including a section where the reference signal changes is increased from a first current to a second current. The first current is larger than 0 (zero). The second current is larger than the first current.

An image sensor according to the present technology includes a pixel, a reference signal output section, an AD conversion section, and a control section. The pixel includes a photoelectric conversion element for performing photoelectric conversion, and outputs an electrical signal. The reference signal output section outputs a variable-level reference signal. The AD conversion section includes a comparator that compares the electrical signal, which is outputted from the pixel, with the reference signal, and performs AD (Analog to Digital) conversion of the electrical signal by using the result of comparison made by the comparator between the electrical signal and the reference signal. The control section exercises control in such a manner that a bias current flowing in the comparator to operate the comparator during a certain section of the reference signal including a section where the reference signal changes is increased from a first current to a second current. The first current is larger than 0 (zero). The second current is larger than the first current.

An electronic apparatus according to the present technology includes an optical system and an image sensor. The optical system collects light. The image sensor receives light, and outputs a signal corresponding to the amount of received light. The image sensor includes a pixel, a reference signal output section, an AD conversion section, and a control section. The pixel includes a photoelectric conversion element for performing photoelectric conversion, and outputs an electrical signal. The reference signal output section outputs a variable-level reference signal. The AD conversion section includes a comparator that compares the electrical signal, which is outputted from the pixel, with the reference signal, and performs AD (Analog to Digital) conversion of the electrical signal by using the result of comparison made by the comparator between the electrical signal and the reference signal. The control section exercises control in such a manner that a bias current flowing in the comparator to operate the comparator during a certain section of the reference signal including a section where the reference signal changes is increased from a first current to a second current. The first current is larger than 0 (zero). The second current is larger than the first current.

The AD conversion device, AD conversion method, image sensor, and electronic apparatus according to the present technology use the result of comparison made by the comparator between the electrical signal and the variable-level reference signal in order to perform AD (Analog to Digital) conversion of the electrical signal. In this AD conversion, the bias current flowing in the comparator to operate the comparator during a certain section of the reference signal including a section where the reference signal changes is increased from the first current, which is larger than 0 (zero), to the second current, which is larger than the first current.

It should be noted that the AD conversion device and the image sensor may be independent from each other or included as internal blocks of a single device.

Advantageous Effect of Invention

The present technology makes it possible to achieve high-speed, low-power-consumption AD conversion.

It should be noted that the present disclosure is not limited to the above advantages and can provide any other advantages described later in this document.

BRIEF DESCRIPTION OF DRAWINGS

FIG. 6 is a circuit diagram illustrating an exemplary schematic configuration of a comparator 73.

DESCRIPTION OF EMBODIMENTS

<Embodiment of Digital Camera to which Present Technology is Applied>

Figure 1:
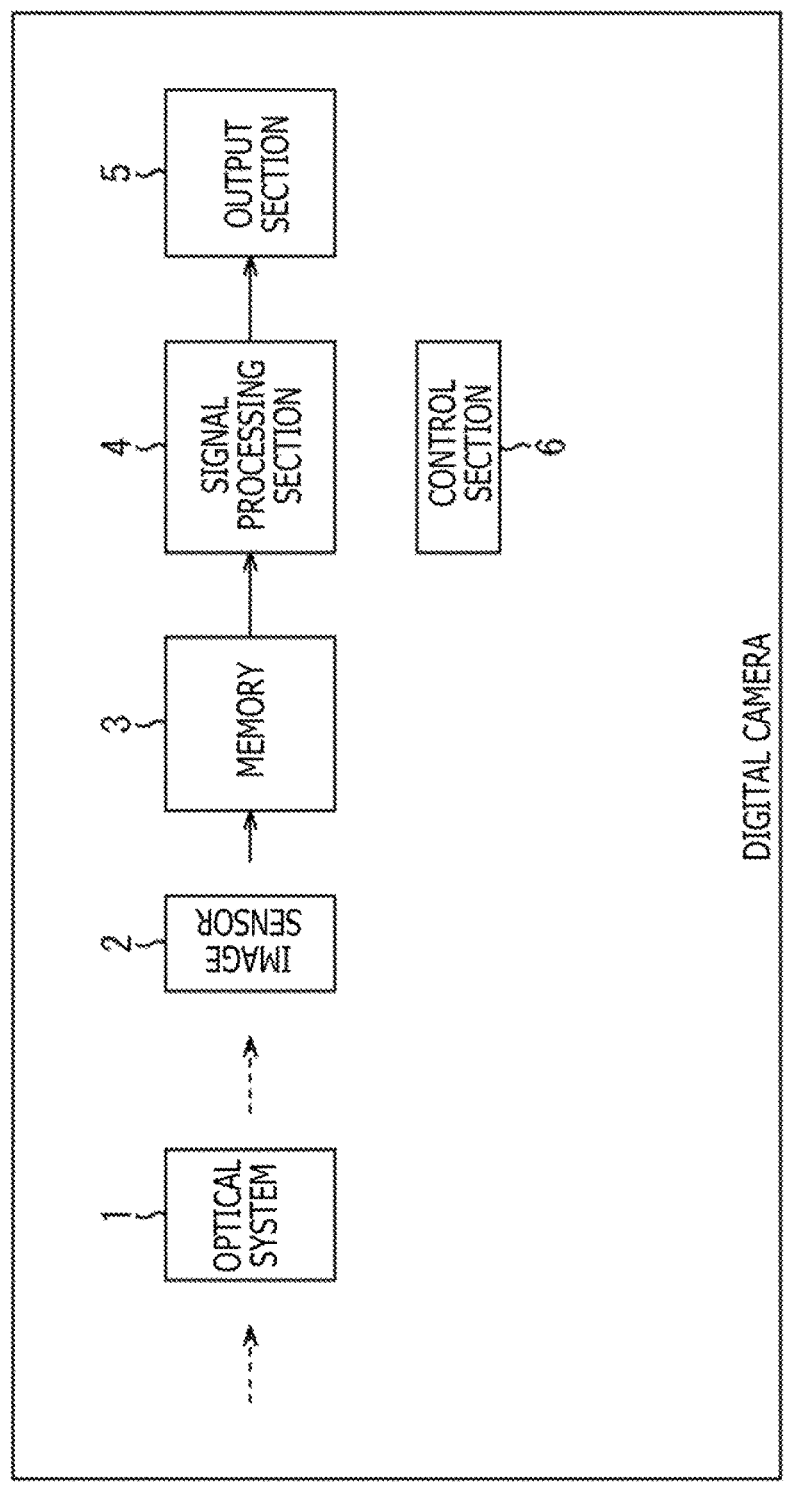
FIG. 1 is a block diagram illustrating an exemplary configuration of an embodiment of a digital camera to which the present technology is applied.

FIG. 1 is a block diagram illustrating an exemplary configuration of an embodiment of a digital camera to which the present technology is applied.

It should be noted that the digital camera is capable of capturing both still images and videos.

Referring to FIG. 1, the digital camera includes an optical system 1, an image sensor 2, a memory 3, a signal processing section 4, an output section 5, and a control section 6.

The optical system 1 includes, for example, a zoom lens, a focus lens, and an iris diaphragm, which are not depicted, and causes external light to enter the image sensor 2.

The image sensor 2 is, for example, a CMOS (Complementary Metal Oxide Semiconductor) image sensor that receives incident light from the optical system 1, performs photoelectric conversion, and outputs image data corresponding to the incident light from the optical system 1.

The memory 3 temporarily stores the image data outputted from the image sensor 2.

The signal processing section 4 performs signal processing on the image data stored in the memory 3, such as signal processing for noise removal and white balance adjustment, and supplies the processed image data to the output section 5.

The output section 5 outputs the image data from the signal processing section 4.

That is, the output section 5 includes a display (not depicted) such as a liquid-crystal display, and displays, as a so-called through-image, an image corresponding to the image data from the signal processing section 4.

Further, the output section 5 includes, for example, a driver (not depicted) for driving a recording medium such as a semiconductor memory, a magnetic disk, or an optical disk, and records the image data from the signal processing section 4 on the recording medium.

The control section 6 controls all blocks included in the digital camera in accordance, for example, with a user operation.

In the digital camera configured as described above, the image sensor 2 receives incident light from the optical system 1, and outputs image data based on the incident light.

The image data outputted from the image sensor 2 is supplied to the memory 3 for storage purposes. The image data stored in the memory 3 is subjected to signal processing by the signal processing section 4. The image data resulting from such signal processing is supplied to the output section 5 for output purposes.

<Exemplary Configuration of Image Sensor 2>

Figure 2:
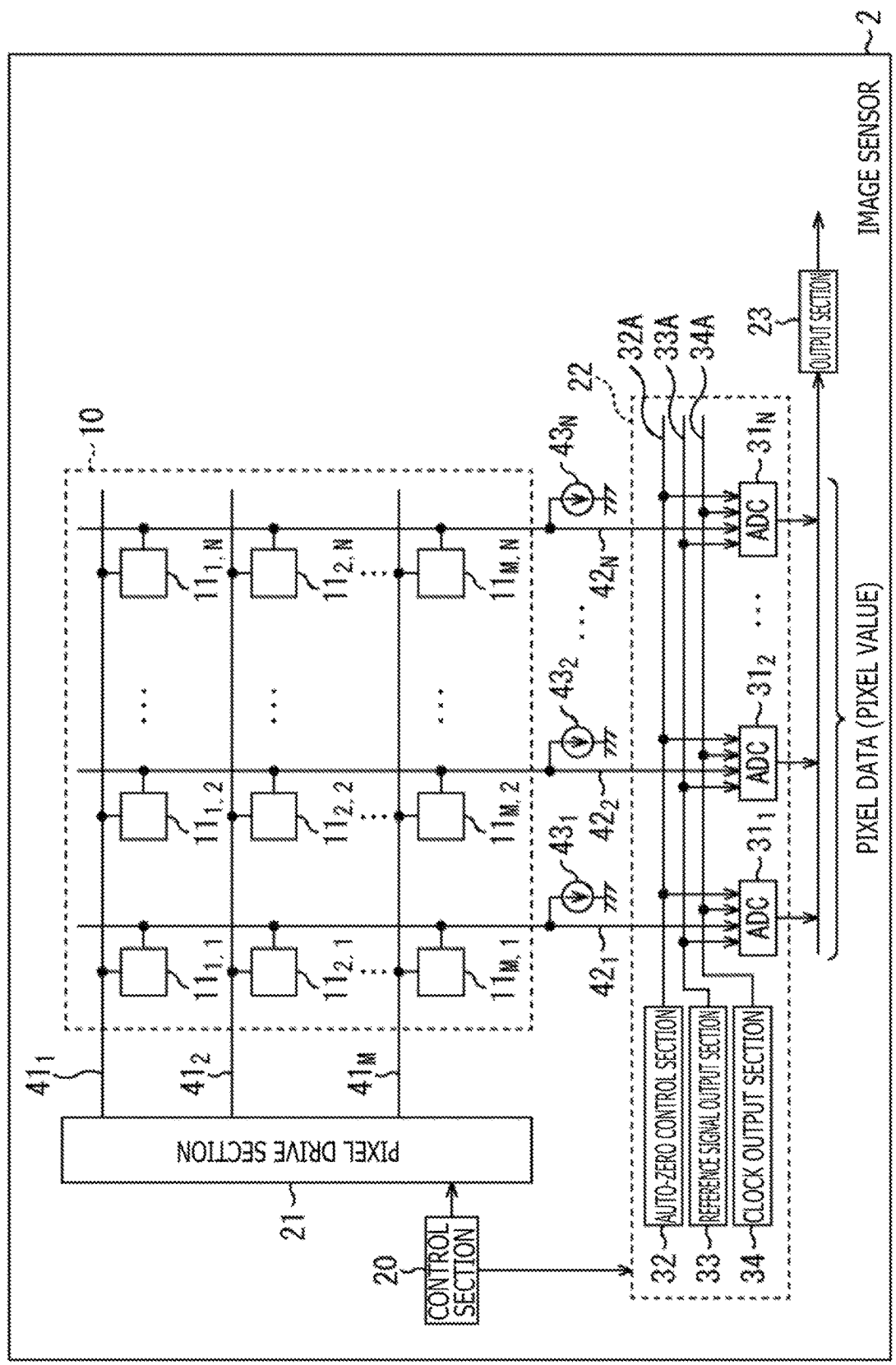
FIG. 2 is a block diagram illustrating an exemplary configuration of an image sensor 2.

FIG. 2 is a block diagram illustrating an exemplary configuration of the image sensor 2 depicted in FIG. 1.

Referring to FIG. 2, the image sensor 2 includes a pixel array 10, a control section 20, a pixel drive section 21, a column-parallel AD conversion device 22, and an output section 23.

The pixel array 10 includes M×N (M and N are integers of 1 or greater) pixels $11_{1,1}$, $11_{1,2}$, ..., $11_{1,N}$, $11_{2,1}$, $11_{2,2}$, ..., $11_{2,N}$, ..., $11_{M,1}$, $11_{M,2}$, ..., $11_{M,N}$ that perform photoelectric conversion, and functions as an imaging section (imaging element) that captures images.

The M×N pixels $11_{1,1}$ to $11_{M,N}$ are arrayed in a two-dimensional plane in a matrix (lattice) of M rows by N columns.

A pixel control line $41_m$ extended in a row direction is connected to N pixels $11_{m,1}$ to $11_{m,N}$ that are lined up in a row direction (horizontal direction) of the m-th line (m=1, 2, ..., M) (from the top) of the pixel array 10.

Further, a VSL (Vertical Signal Line) $42_n$ extended in a column direction is connected to M pixels $11_{1,n}$ to $11_{M,n}$ that are lined up in a column direction (vertical direction) of the n-th column (n=1, 2, ..., N) (from the left). The VSL $42_n$ is connected not only to the pixels $11_{1,n}$ to $11_{M,n}$ but also to a current source $43_n$.

The pixel $11_{m,n}$ performs photoelectric conversion of light incident on it (incident light). Further, the pixel $11_{m,n}$ outputs a voltage (electrical signal) corresponding to an electrical charge derived from the photoelectric conversion to the VSL $42_n$ in accordance with control exercised by the pixel drive section 21 through the pixel control line $41_m$.

It should be noted that the pixel $11_{m,n}$ is capable of performing photoelectric conversion of light having a predetermined color that is incident, for example, through a Bayer arrangement of color filters (not depicted).

In accordance, for example, with a predetermined logic, the control section 20 controls the pixel drive section 21, the column-parallel AD conversion device 22 (e.g., an auto-zero control section 32 and a reference signal output section 33 included in the column-parallel AD conversion device 22), and other relevant blocks.

Under the control of the control section 20, the pixel drive section 21 controls (drives), through the pixel control line $41_m$, the pixels $11_{m,1}$ to $11_{m,N}$ that are connected to the pixel control line $41_m$.

The column-parallel AD conversion device 22 is connected to each of the pixels $11_{m,1}$ to $11_{m,N}$ lined up in individual rows through the VSLs $42_1$ to $42_N$. Therefore, the electrical signal (voltage) (hereinafter referred to also as the VSL signal) outputted from the pixel $11_{m,n}$ to the VSL $42_n$ is supplied to the column-parallel AD conversion device 22.

The column-parallel AD conversion device 22 parallelly performs AD conversion of the VSL signal that is supplied from each of the pixels $11_{m,1}$ to $11_{m,N}$ lined up in a row through the VSLs $42_1$ to $42_N$. The column-parallel AD conversion device 22 then supplies digital data derived from the AD conversion to the output section 23 as pixel values (pixel data) of the pixels $11_{m,1}$ to $11_{m,N}$.

Here, the column-parallel AD conversion device 22 is able to parallelly perform AD conversion of all electrical signals of N pixels $11_{m,1}$ to $11_{m,N}$ lined up in a row, and is also able to parallelly perform AD conversion of electrical signals of one or more pixels but less than N pixels out of the N pixels $11_{m,1}$ to $11_{m,N}$.

However, for the sake of simplicity, the following description assumes that the column-parallel AD conversion device 22 parallelly performs AD conversion of all VSL signals of N pixels $11_{m,1}$ to $11_{m,N}$ lined up in a row.

In order to parallelly perform AD conversion of all VSL signals of N pixels $11_{m,1}$ to $11_{m,N}$ lined up in a row, the column-parallel AD conversion device 22 includes N ADCs (Analog to Digital Converters) $31_1$ to $31_N$.

The column-parallel AD conversion device 22 further includes an auto-zero control section 32, a reference signal output section 33, and a clock output section 34.

The auto-zero control section 32 supplies (outputs) an AZ pulse (auto-zero pulse) to the ADCs $31_1$ to $31_N$ through an auto-zero control line 32A. The AZ pulse is a signal for controlling an auto-zero process of later-described comparators 73 and 103 included in the ADC $31_n$.

The reference signal output section 33 includes, for example, a DAC (Digital to Analog Converter), and outputs a reference signal to the ADCs $31_1$ to $31_N$ through a reference signal line 33A. The reference signal has a period during which its level (voltage) changes from a predetermined initial value to a predetermined final value at a fixed gradient like a ramp signal.

The clock output section 34 supplies (outputs) a clock at a predetermined frequency to the ADCs $31_1$ to $31_N$ through a clock line 34A.

The ADC $31_n$ is connected to a VSL $41_n$. Therefore, a VSL signal (electrical signal) is supplied to the ADC $31_n$. The VSL signal is outputted to the VSL $41_n$ by the pixel $11_{m,n}$.

The ADC $31_n$ performs AD conversion of the VSL signal outputted from the pixel $11_{m,n}$ by using the reference signal from the reference signal output section 33 and the clock from the clock output section 34. Further, the ADC $31_n$ performs CDS (Correlated Double Sampling) to obtain digital data that acts as a pixel value.

Here, the ADC $31_n$ performs AD conversion of the VSL signal of the pixel $11_{m,n}$ by comparing the VSL signal of the pixel $11_{m,n}$ with the reference signal from the reference signal output section 33 and counting the time required for the level of the reference signal changes until the level of the VSL signal of the pixel $11_{m,n}$ coincides with the level of the reference signal (until the magnitude relationship between the VSL signal and the reference signal is inverted).

The ADC $31_n$, counts the clock from the clock output section 34 to determine the time required for the level of the reference signal to change until the level of the VSL signal of the pixel $11_{m,n}$ coincides with the level of the reference signal.

Further, the VSL signals of N pixels $11_{m,1}$ to $11_{m,N}$ in each of the first to M-th rows of the pixel array 10 are supplied to N ADCs $31_1$ to $31_N$, for example, sequentially beginning with the first row, and AD conversion and CDS of the supplied VSL signals are performed on a row-by-row basis.

The output section 23 selects a column, from which a pixel value is to be read, reads the result of AD conversion (and CDS) of the pixel $11_{m,n}$, which is determined by the ADC $31_n$, from the ADC $31_n$ in the selected column, as the pixel value, and outputs the pixel value to the outside (the memory 3 (FIG. 1) in the present embodiment).

Here, it is assumed that the ADC $31_n$ performs CDS in addition to AD conversion. However, an alternative is to let the ADC $31_n$ perform AD conversion only and permit the output section 23 to perform CDS.

Additionally, CDS will be described later as needed.

<Exemplary Configuration of Pixel $11_{m,n}$>

Figure 3:
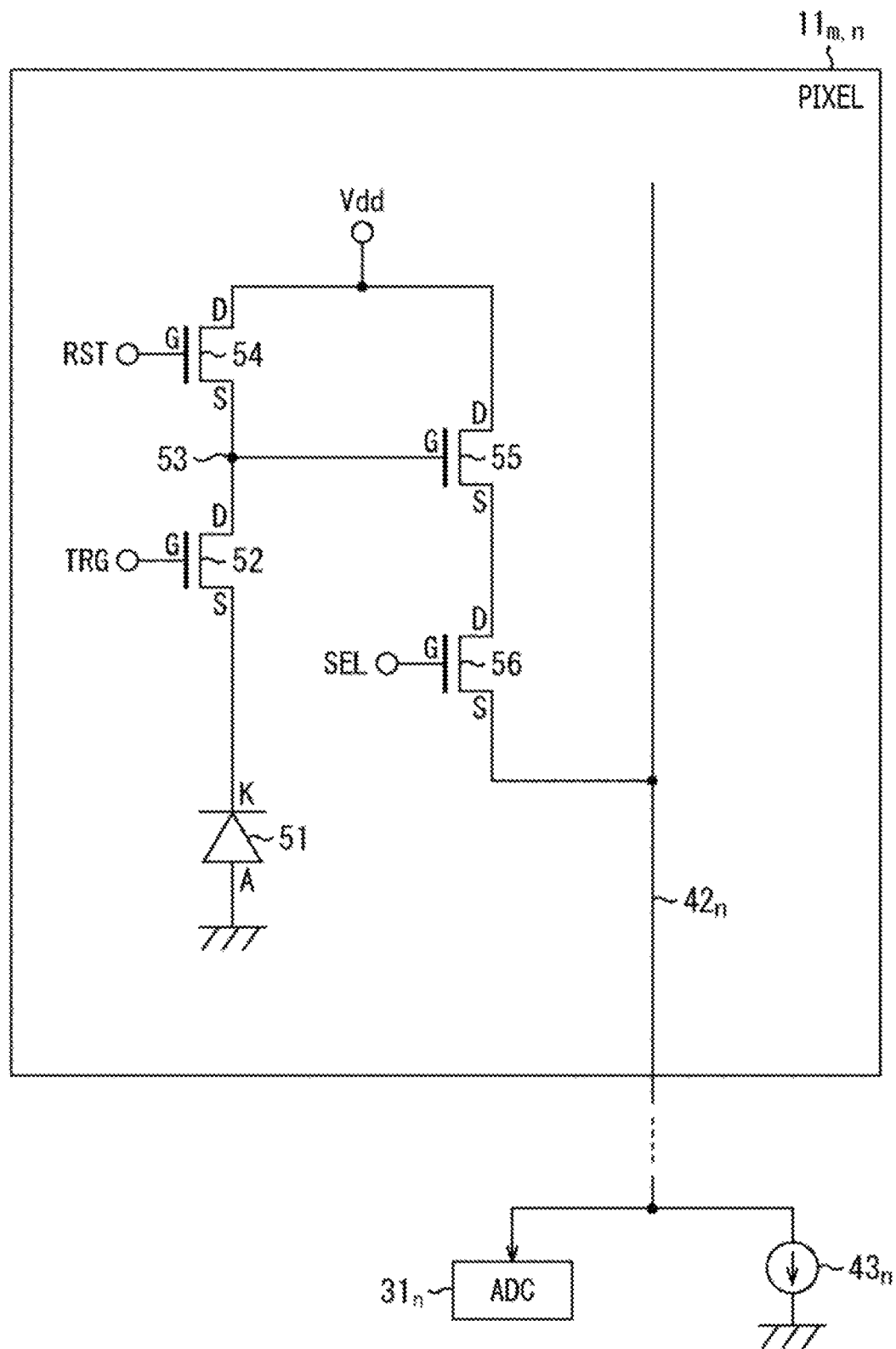
FIG. 3 is a circuit diagram illustrating an exemplary configuration of a pixel $11_{m,n}$.

FIG. 3 is a circuit diagram illustrating an exemplary configuration of the pixel $11_{m,n}$ depicted in FIG. 2.

Referring to FIG. 3, the pixel $11_{m,n}$ includes a PD (Photo Diode) 51 and four NMOS (negative channel MOS) FETs (Field Effect Transistors) 52, 54, 55 and 56.

Further, in the pixel $11_{m,n}$, the drain of the FET 52, the source of the FET 54, and the gate of the FET 55 are connected. At the point of the connection, an FD (Floating Diffusion) (capacitance) 53 is formed to convert an electrical charge to a voltage.

The PD 51 is an example of a photoelectric conversion element that performs photoelectric conversion by receiving incident light and producing an electrical charge corresponding to the received incident light.

The anode of the PD 51 is connected to a ground (is grounded), and the cathode of the PD 51 is connected to the source of the FET 52.

The FET 52 transfers an electrical charge applied to the PD 51 from the PD 51 to the FD 53. Accordingly, the FET 52 is hereinafter referred to also as the transfer Tr 52.

The source of the transfer Tr 52 is connected to the cathode of the PD 51, and the drain of the transfer Tr 52 is connected to the source of the FET 54 through the FD 53.

Further, the gate of the transfer Tr 52 is connected to the pixel control line $41_m$. A transfer pulse TRG is supplied to the gate of the transfer Tr 52 through the pixel control line $41_m$.

Here, control signals supplied from the pixel drive section 21 (FIG. 2) to the pixel control line $41_m$ in order to drive (control) the pixel $11_{m,n}$ through the pixel control line $41_m$ include a later-described reset pulse RST and a selection pulse SEL as well as the transfer pulse TRG.

The FD 53 is a region that is formed at the point of connection between the drain of the transfer Tr 52, the source of the FET 54, and the gate of the FET 55 in order to convert an electrical charge to a voltage like a capacitor.

The FET 54 resets an electrical charge (voltage (potential)) applied to the FD 53. Accordingly, the FET 54 is hereinafter referred to also as the reset Tr 54.

The drain of the reset Tr 54 is connected to a power supply Vdd.

Further, the gate of the reset Tr 54 is connected to the pixel control line $41_m$, and a reset pulse RST is supplied to the gate of the reset Tr 54 through the pixel control line $41_m$.

The FET 55 buffers the voltage of the FD 53. Accordingly, the FET 55 is hereinafter referred to also as the amplifier Tr 55.

The gate of the amplifier Tr 55 is connected to the FD 53, and the drain of the amplifier Tr 55 is connected to the power supply Vdd. Further, the source of the amplifier Tr 55 is connected to the drain of the FET 56.

The FET 56 selects the output of an electrical signal (VSL signal) to the VSL $42_n$. Accordingly, the FET 56 is hereinafter referred to also as the selection Tr 56.

The source of the selection Tr 56 is connected to the VSL $42_n$.

Further, the gate of the selection Tr 56 is connected to the pixel control line $41_m$, and a selection pulse SEL is supplied to the gate of the selection Tr 56 through the pixel control line $41_m$.

Here, when the source of the amplifier Tr 55 is connected to the current source $43_n$ through the selection Tr 56 and the VSL $42_n$, the amplifier Tr 55 and the current source $43_n$ form an SF (Source Follower) (an SF circuit). Therefore, the FD 53 is connected to the VSL $42_n$ through the SF.

It should be noted that the pixel $11_{m,n}$ may be formed without the selection Tr 56.

Further, the pixel $11_{m,n}$ may be configured as a shared pixel so that the FD 53 or the selection Tr 56 is shared by a plurality of the PDs 51 and transfer Tr 52.

In the pixel $11_{m,n}$ configured as described above, the PD 51 receives light incident on it and performs photoelectric conversion to start producing an electrical charge corresponding to the amount of received incident light. Here, it is assumed for simplicity of explanation that the selection pulse SEL is at the H level, and that the selection Tr 56 is on.

When a predetermined period of time (exposure time) elapses after the production of the electrical charge is started by the PD 51, the pixel drive section 21 (FIG. 2) temporarily changes the level of the transfer pulse TRG from the L (Low) level to the H (High) level.

When the transfer pulse TRG is temporarily at the H level, the transfer Tr 52 is temporarily on.

When the transfer Tr 52 turns on, an electrical charge applied to the PD 51 is transferred and applied to the FD 53 through the transfer Tr 52.

Before temporarily setting the transfer pulse TRG at the H level, the pixel drive section 21 temporarily sets the reset pulse RST at the H level. This temporarily turns on the reset Tr 54.

When the reset Tr 54 is turned on, the FD 53 is connected to the power supply Vdd through the reset Tr 54, and the electrical charge on the FD 53 is swept to the power supply Vdd and reset through the reset Tr 54.

Here, when the FD 53 is connected to the power supply Vdd to reset the electrical charge on the FD 53 as described above, the pixel $11_{m,n}$ is reset.

After the electrical charge on the FD 53 is reset, the pixel drive section 21 temporarily sets the transfer pulse TRG at the H level as described above. This temporarily turns on the transfer Tr 52.

When the transfer Tr 52 turns on, the electrical charge on the PD 51 is transferred and applied to the reset FD 53 through the transfer Tr 52.

A voltage (potential) corresponding to the electrical charge applied to the FD 53 is outputted, as a VSL signal, to the VSL $42_n$ through the amplifier Tr 55 and the selection Tr 56.

The ADC $31_n$ (FIG. 2) connected to the VSL $42_n$ performs AD conversion on a reset level that is represented by a VSL signal outputted immediately after the reset of the pixel $11_{m,n}$.

Further, the ADC $31_n$ performs AD conversion on a signal level (including the reset level and the level of a pixel value) represented by a VSL signal (a voltage corresponding to an electrical charge applied to the PD 51 and transferred to the FD 53) that is outputted after the transfer Tr 52 is temporarily turned on.

Subsequently, the ADC $31_n$ performs CDS to determine, as a pixel value, the difference between the result of AD conversion of the reset level (hereinafter referred to also as the reset level AD value) and the result of AD conversion of the signal level (hereinafter referred to also as the signal level AD value).

<Exemplary Configuration of ADC $31_n$>

Figure 4:
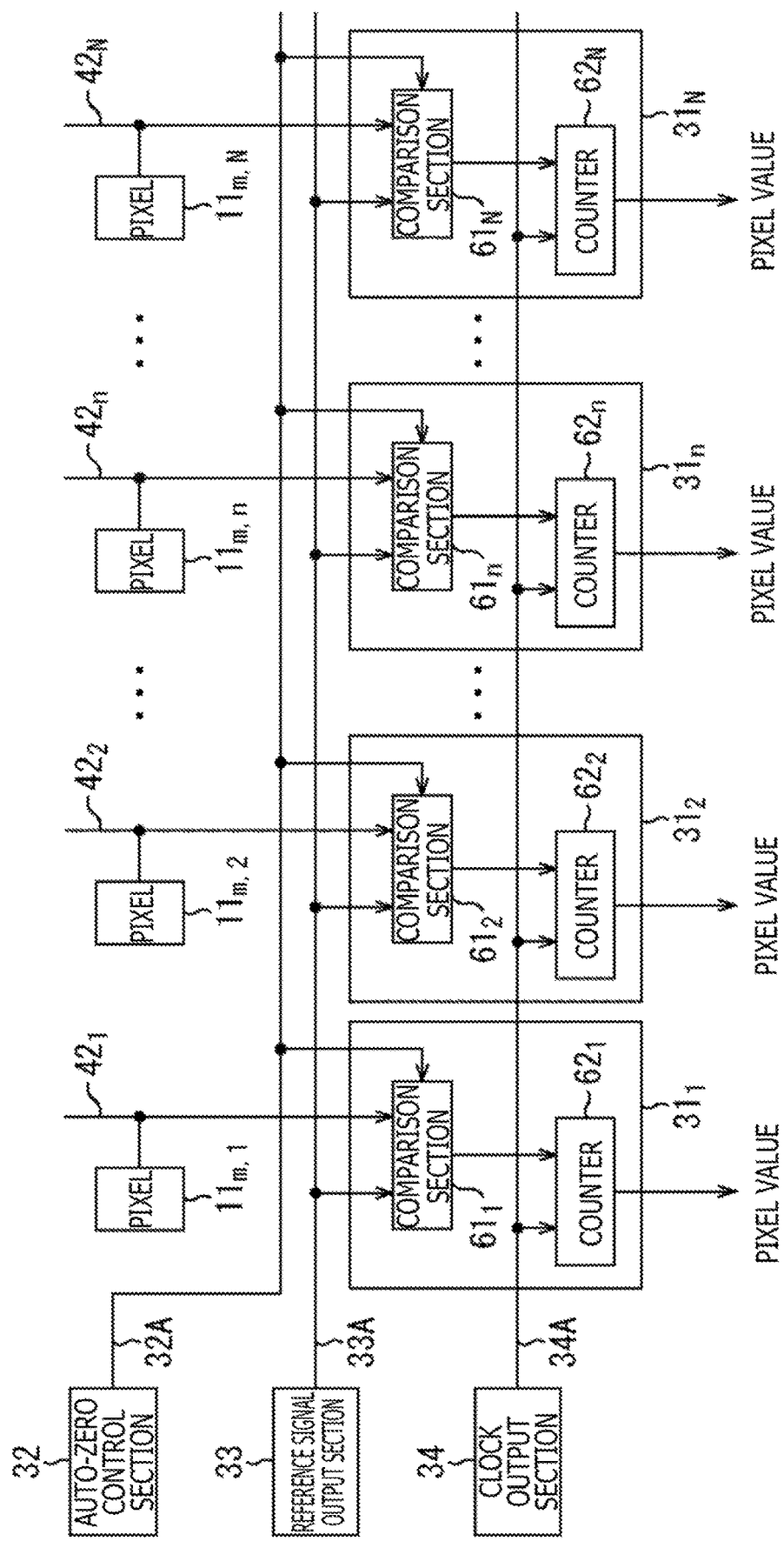
FIG. 4 is a block diagram illustrating an exemplary configuration of an ADC $31_n$.

FIG. 4 is a block diagram illustrating an exemplary configuration of the ADC $31_n$ depicted in FIG. 2.

The ADC $31_n$ includes a comparison section $61_n$ and a counter $62_n$, and performs reference signal comparison AD conversion and CDS.

A reference signal from the reference signal output section 33 and a VSL signal (reset level and signal level) of the pixel $11_{m,n}$ are supplied to the comparison section $61_n$.

The comparison section $61_n$ compares the supplied reference signal and VSL signal, and outputs the result of the comparison.

More specifically, if the reference signal is greater than the VSL signal, the comparison section $61_n$ outputs, for example, the L level, which is one of the H and L levels.

If, by contrast, the VSL signal is greater than the voltage of the reference signal, the comparison section $61_n$ outputs the H level, which is the remaining one of the H and L levels.

It should be noted that the auto-zero control section 32 supplies the AZ pulse to the comparison section $61_n$ through the auto-zero control line 32A. In accordance with the AZ pulse from the auto-zero control section 32, the comparison section $61_n$ performs the auto-zero process.

Here, in the auto-zero process, the comparison section $61_n$ is (initially) set up in such a manner as to obtain a comparison result indicating that two input signals given to the comparison section $61_n$, namely, the reference signal and the VSL signal, coincide with each other.

An output from the comparison section $61_n$ and a clock from the clock output section 34 are supplied to the counter $62_n$.

At a time point when, for example, (the level of) the reference signal supplied from the reference signal output section 33 to the comparison section $61_n$ starts changing, the counter $62_n$ starts counting the clock from the clock output section 34. When the output from the comparison section $61_n$ changes, for example, from the L level to the H level, that is, when the reference signal and the VSL signal, which are supplied to the comparison section $61_n$, are equal in level (the magnitude relationship between the reference signal and the VSL signal is inverted), the counter $62_n$ finishes counting the clock from the clock output section 34.

Subsequently, the counter $62_n$ outputs the count of the clock as the result of AD conversion of the VSL signal to be supplied to the comparison section $61_n$.

Here, the reference signal output section 33 outputs, as the reference signal, a signal having a slope (a sloped waveform) that decreases a voltage, for example, at a constant rate from a predetermined initial value to a predetermined final value.

In the above case, the counter $62_n$ counts the time of the interval between the beginning of the slope and the instant at which the voltage of the reference signal coincides with the voltage of the VSL signal supplied to the comparison section $61_n$, and the resulting count is regarded as the result of AD conversion of the VSL signal to be supplied to the comparison section $61_n$.

As described above, the ADC $31_n$ performs AD conversion of the VSL signal by using the result of comparison made by the comparison section $61_n$ between the reference signal and the VSL signal.

The ADC $31_n$ acquires the result of AD conversion of the reset level and signal level of the VSL signal to be supplied from the pixel $11_{m,n}$ to the comparison section $61_n$. The ADC $31_n$ then performs CDS to determine the difference between the result of AD conversion of the signal level (signal level AD value) and the result of AD conversion of the reset level (reset level AD value), and outputs the difference determined by the CDS as the pixel value of the pixel $11_{m,n}$.

It should be noted that the ADC $31_n$ may alternatively perform CDS by, for example, controlling a clock counting operation of the counter $62_n$ instead of actually performing an arithmetic operation to determine the difference between the signal level AD value and the reset level AD value.

More specifically, CDS may be performed, for example, by allowing the counter $62_n$, in the case of the reset level, to count the clock while decrementing the count by one at a time, or by allowing the counter $62_n$, in the case of the signal level, to count the clock while conversely incrementing the count by one at a time with a clock count in the case of the reset level regarded as the initial value, performing AD conversion of the reset level and the signal level, and determining the difference between the signal level (the result of its AD conversion) and the reset level (the result of its AD conversion).

Further, the reference signal used in the present embodiment is a ramp signal having a slope that decreases at a constant rate. Alternatively, however, the reference signal to be used may be, for example, a ramp signal having a slope that increases at a constant rate or a signal whose level changes in a nonlinear manner.

<First Exemplary Configuration of Comparison Section $61_n$>

Figure 5:
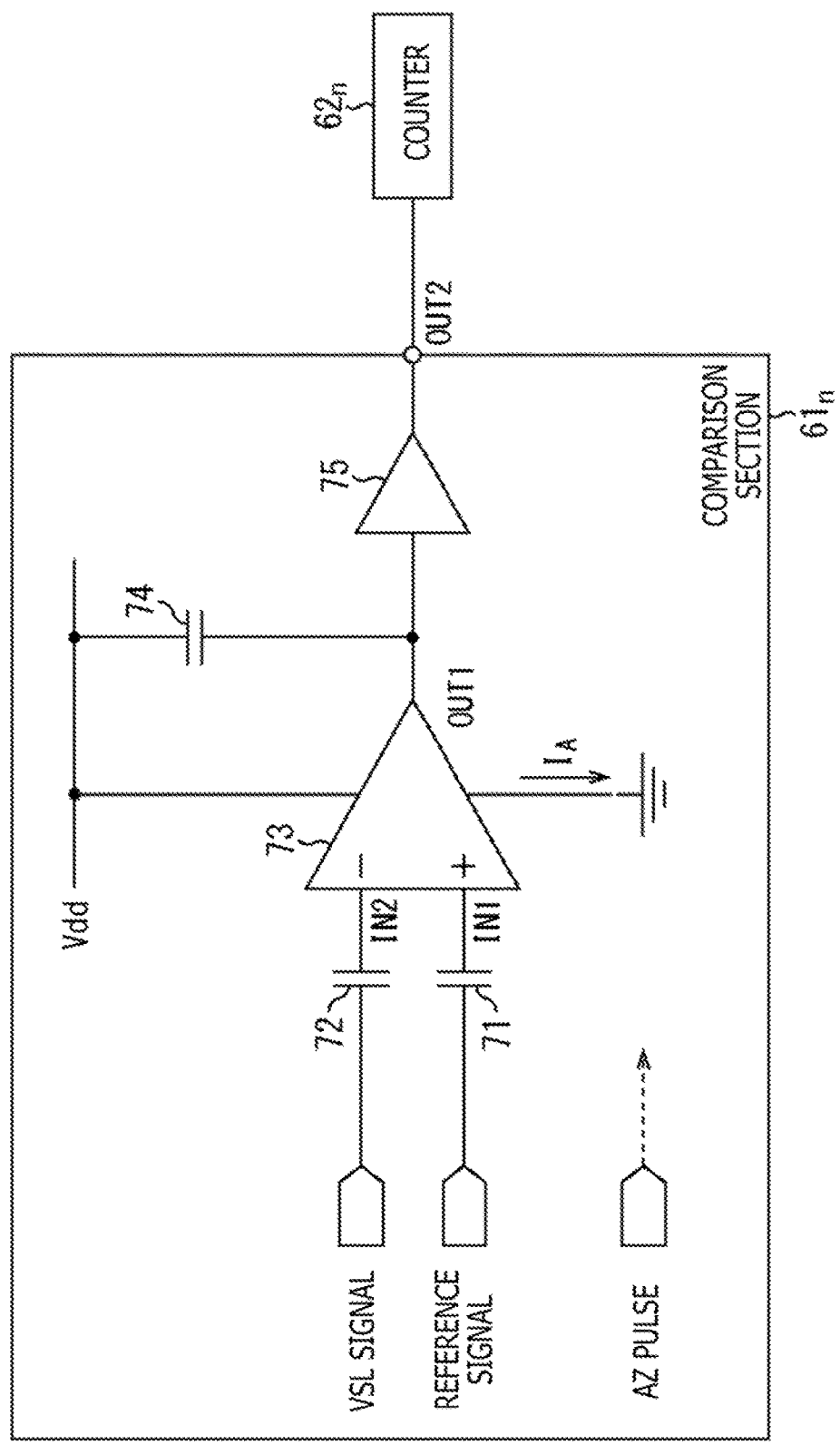
FIG. 5 is a diagram illustrating a first exemplary configuration of a comparison section $61_n$.

FIG. 5 is a diagram illustrating a first exemplary configuration of the comparison section $61_n$ depicted in FIG. 4.

The comparison section $61_n$ includes capacitors (capacitances) 71 and 72, a comparator 73, a capacitor 74, and an inverter 75.

The capacitor 71 is used for auto-zero processing. One end of the capacitor 71 is connected to a non-inverting input terminal (+) IN1 of the comparator 73, and the reference signal is supplied to the other end. Therefore, the reference signal is supplied to the non-inverting input terminal IN1 of the comparator 73 through the capacitor 71.

The capacitor 72 is used for auto-zero processing. One end of the capacitor 72 is connected to an inverting input terminal (−) IN2 of the comparator 73, and the VSL signal is supplied to the other end. Therefore, the VSL signal is supplied to the inverting input terminal IN2 of the comparator 73 through the capacitor 72.

The comparator 73 includes the non-inverting input terminal IN1, the inverting input terminal IN2, and an output terminal OUT1.

The comparator 73 compares the reference signal supplied to the non-inverting input terminal IN1 through the capacitor 71 with the VSL signal supplied to the inverting input terminal IN2 through the capacitor 72, and outputs the result of the comparison from the output terminal OUT1.

More specifically, if the reference signal supplied to the non-inverting input terminal IN1 is greater than the VSL signal supplied to the inverting input terminal IN2, the comparator 73 outputs, for example, the H level, which is one of the H and L levels.

If, by contrast, the VSL signal supplied to the inverting input terminal IN2 is greater than the voltage of the reference signal supplied to the non-inverting input terminal IN1, the comparator 73 outputs the L level, which is the remaining one of the H and L levels.

It should be noted that the comparator 73 is connected to the power supply Vdd and the GND (ground). When electrical power is received from the power supply Vdd, a bias current $I_A$ for operating the comparator 73 flows to operate the comparator 73.

The output terminal OUT1 of the comparator 73 is connected to one end of the capacitor 74 and to the inverter 75.

The other end of the capacitor 74 is connected to the power supply Vdd. It should be noted that the other end of the capacitor 74 may be connected to the GND instead of the power supply Vdd.

In the comparison section $61_n$, the capacitor 74 is connected to the output terminal OUT1 of the comparator 73. Therefore, the frequency band of a signal is limited to suppress noise.

The inverter 75 inverts the output from the comparator 73 (the result of comparison between the VSL signal and the reference signal), and outputs the inverted output of the comparator 73 from an output terminal OUT2 of the comparison section $61_n$ to the counter $62_n$.

It should be noted that, as described with reference to FIG. 4, the AZ pulse is supplied from the auto-zero control section 32 to the comparison section 61$_n$ through the auto-zero control line 32A, and that the comparison section 61$_n$ performs the auto-zero process in accordance with the supplied AZ pulse.

In the auto-zero process, as the output terminal OUT1 of the comparator 73 is temporarily connected to the non-inverting input terminal IN1 and the inverting input terminal IN2, the capacitors 71 and 72 are charged in such a manner as to obtain a comparison result indicating that a signal currently supplied to the non-inverting input terminal IN1 of the comparator 73 coincides with a signal currently supplied to the inverting input terminal IN2.

In order to avoid complexity, FIG. 5 does not depict a circuit that temporarily connects the output terminal OUT1 of the comparator 73 to the non-inverting input terminal IN1 and the inverting input terminal IN2.

According to the auto-zero process, the comparator 73 is able to determine the magnitude relationship between a voltage applied to the non-inverting input terminal IN1 and a voltage applied to the inverting input terminal IN2 with reference to a state where the voltage applied to the non-inverting input terminal IN1 of the comparator 73 is equal to the voltage applied to the inverting input terminal IN2 in the auto-zero process.

<Exemplary Configuration of Comparator 73>

FIG. 6 is a circuit diagram illustrating an exemplary schematic configuration of the comparator 73 depicted in FIG. 5.

Referring to FIG. 6, the comparator 73 includes FETs 81, 82, 83 and 84, a current source 91, and FETs 92 and 93.

The FET 81 and the FET 82 are NMOS (Negative Channel MOS) FETs. The sources of these FETs 81 and 82 are connected. Further, the point of connection between the sources of the FET 81 and FET 82 is connected to the drain of the NMOS FET 93, which acts as a current source. The FET 81 and the FET 82 form a differential pair.

The gate of the FET 81 is connected to the non-inverting input terminal IN1 of the comparator 73, and the gate of the FET 82 is connected to the inverting input terminal IN2 of the comparator 73.

The comparator 73 is configured so that the differential pair, which is formed by the FETs 81 and 82 as described above, is at the input stage.

The FET 83 and the FET 84 are PMOS (Positive Channel MOS) FETs. The gates of these FETs 83 and 84 are connected.

Further, the sources of the FETs 83 and 84 are connected to the power supply Vdd, and the point of connection between the gates of the FETs 83 and 84 is connected to the drain of the FET 83. Therefore, the FET 83 and the FET 84 form a current mirror.

While a current mirror is formed by the FETs 83 and 84, the drain of the FET 83 is connected to the drain of the FET 81, and the drain of the FET 84 is connected to the drain of the FET 82.

Further, the point of connection between the drains of the FETs 82 and 84 is connected to the output terminal OUT1 of the comparator 73.

The current source 91 is connected at one end to the power supply Vdd and at the other end to the drain of the FET 92. The current source 91 supplies a predetermined constant current Ibias to the FET 92.

The FET 92 is an NMOS FET. The source of the FET 92 is connected to the GND, and the gate of the FET 92 is connected to its drain. Further, the gate of the FET 92 is connected to the FET 93 whose source is connected to the GND.

The FETs 92 and 93 respectively act as a mirror source and a mirror destination to form a current mirror.

Consequently, the FET 93 acts as a current source for supplying a constant current that is mirror-ratio-times larger than the current flowing in the FET 92.

The constant current supplied from the FET 93 is the bias current $I_A$ for operating the comparator 73.

Although FIG. 6 indicates that the comparator 73 includes the current source 91 and the FET 92, the current source 91 and the FET 92 may be disposed outside of the comparator 73 and shared by a plurality of ADCs 31$_n$, that is, for example, N ADCs 31$_1$ to 31$_N$.

In the comparator 73 configured as described above, a current I1 corresponding to the voltage of the reference signal supplied through the capacitor 71, which is the gate voltage of the FET 81, flows to the FET 81 (from its drain to its source) of the differential pair, and a current I2 corresponding to the voltage of the VSL signal supplied through the capacitor 72, which is the gate voltage of the FET 82, flows to the FET 82 (from its drain to its source) of the differential pair.

The currents I1 and I2 flow in such a manner that the sum of the currents I1 and I2 is equal to the bias current $I_A$ supplied from the FET 93, which acts as a current source.

A current flowing to the FETs 83 and 84 (from their sources to their drains), which form a current mirror, is the same as the current I1 flowing to the FET 81.

When the voltage applied from the non-inverting input terminal IN1 to the gate of the FET 81 through the capacitor 71 (the gate voltage of the FET 81) is higher than the voltage applied to the gate of the FET 82 from the inverting input terminal IN2 to the gate of the FET 82 through the capacitor 72 (the gate voltage of the FET 82), the current I1 flowing to the FET 81 is larger than the current I2 flowing to the FET 82.

In the above case, the current flowing to the FET 84 is the same as the current I1 flowing to the FET 81. However, the current I2 flowing to the FET 82 connected to the FET 84 is smaller than the current I1. Therefore, the drain-source voltage of the FET 82 increases in order to increase the current I2.

As a result, the voltage VOUT (hereinafter referred to also as the comparator output) at the output terminal OUT1, which is the point of connection between the FETs 82 and 84, is at the H level.

Meanwhile, when the gate voltage of the FET 82 is higher than the gate voltage of the FET 81, the current I2 flowing to the FET 82 is larger than the current I1 flowing to the FET 81.

In the above case, the current flowing to the FET 84 is the same as the current I1 flowing to the FET 81. However, the current I2 flowing to the FET 82 connected to the FET 84 is larger than the current I1. Therefore, the drain-source voltage of the FET 82 decreases in order to decrease the current I2.

As a result, the comparator output VOUT at the output terminal OUT1, which is the point of connection between the FETs 82 and 84, is at the L level.

The comparator output VOUT at the output terminal OUT1 is band-limited by the capacitor 74 and outputted to the inverter 75 (FIG. 5).

<Operation of Image Sensor 2>

Figure 7:
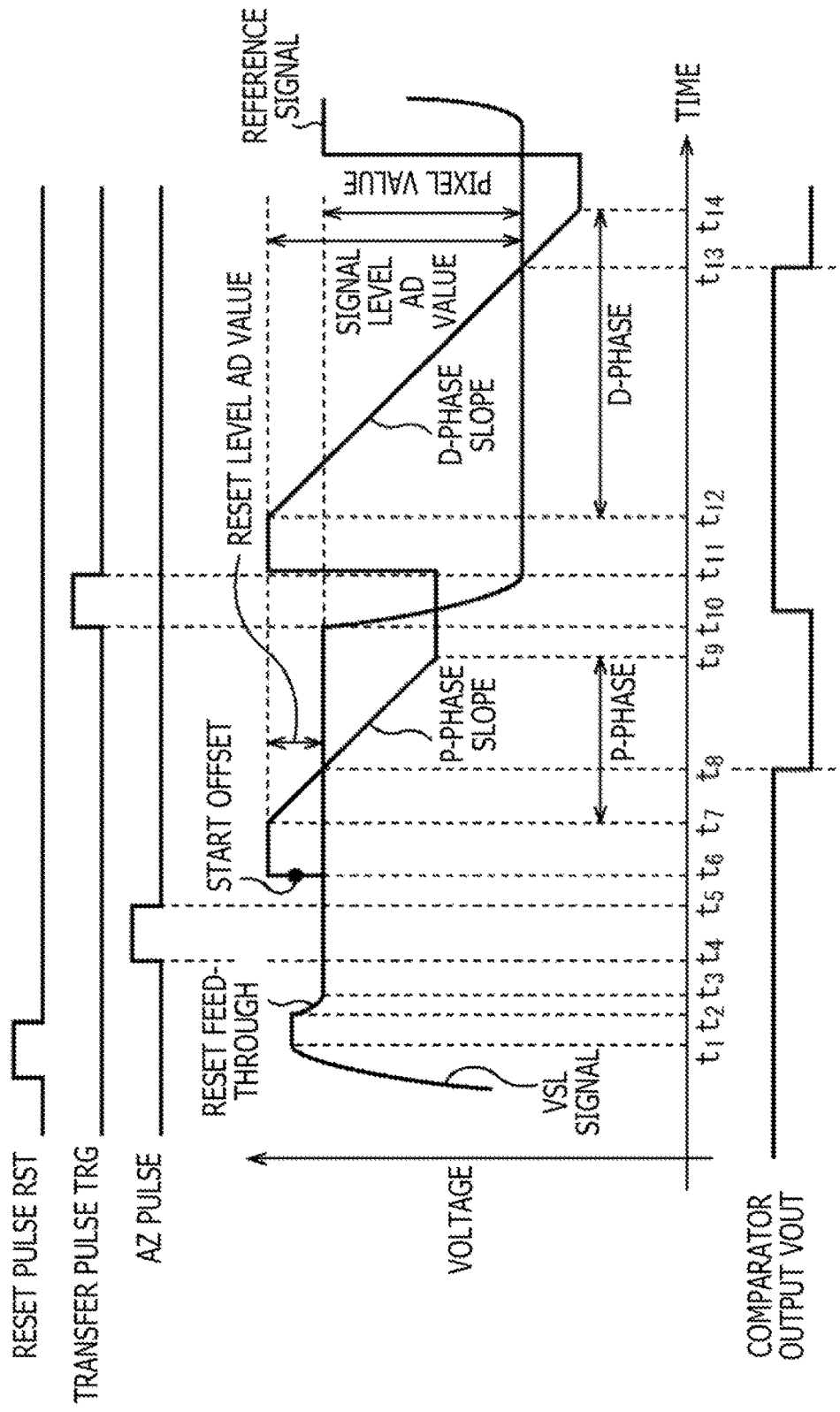
FIG. 7 is a diagram illustrating an operation of the image sensor 2.

FIG. 7 is a diagram illustrating an operation of the image sensor 2 (FIG. 2).

It should be noted that, in FIG. 7, the horizontal axis represents time while the vertical axis represents voltage.

FIG. 7 is a waveform diagram illustrating an exemplary reference signal (its voltage) supplied from the reference signal output section 32 of the image sensor 2 to the non-inverting input terminal IN1 of the comparison section $61_n$ in the ADC $31_n$ through the reference signal line 33A, and an exemplary VSL signal (its voltage) which is an electrical signal supplied from the pixel $11_{m,n}$ to the inverting input terminal IN2 of the comparator 73 included in the comparison section $61_n$ of the ADC $31_n$ through the VSL $42_n$.

It should be noted that FIG. 7 depicts not only the VSL signal and the reference signal, but also the transfer pulse TRG applied to the transfer Tr 52 (FIG. 3) (its gate), the reset pulse RST applied to the reset Tr 54, the AZ pulse applied from the auto-zero control section 32 to the comparison section $61_n$ (FIG. 5), and the comparator output VOUT from the output terminal OUT1 of the comparator 73 (FIG. 5).

Further, referring to FIG. 7, the VSL signal represents a gate voltage applied to the gate of the FET 81 in the comparator 73 (FIG. 6) (not a voltage on the VSL $42_n$ itself), and the reference signal represents a gate voltage applied to the gate of the FET 82 in the comparator 73 (not a voltage on the reference signal line 34A itself).

In the image sensor 2, the reset pulse RST is temporarily set at the H level. This resets the pixel $11_{m,n}$.

When the pixel $11_{m,n}$ is reset, the FD 53 is connected to the power supply Vdd through the reset Tr 54 as described with reference to FIG. 3, and then the electrical charge on the FD 53 is reset. Therefore, an increase occurs in the voltage of the VSL signal outputted from the pixel $11_{m,n}$, that is, the voltage of the VSL signal on the VSL $42_n$, which is outputted from the FD 53 in the pixel $11_{m,n}$ through the amplifier Tr 55 and the selection Tr 56. Then, at time $t_1$, this voltage corresponds to the voltage of the power supply Vdd.

While the FD 53 is connected to the power supply Vdd, the VSL signal maintains the voltage corresponding to the voltage of the power supply Vdd. Subsequently, when the reset pulse RST is at the L level at time $t_2$, some electrical charge moves within the pixel $11_{m,n}$ so that a slight amount of electrical charge enters the FD 53. As a result, the VSL signal slightly falls.

FIG. 7 indicates that the electrical charge movement within the pixel $11_{m,n}$ causes the VSL signal to slightly fall between time $t_2$ at which the reset pulse RST is at the L level and subsequent time $t_3$.

The above-mentioned VSL signal fall after the reset of the pixel $11_{m,n}$ is called "a reset feed-through".

After the reset of the pixel $11_{m,n}$ (or during its reset), the auto-zero control section 32 causes the AZ pulse to change from the L level to the H level. This causes the comparison section $61_n$ to start the auto-zero process.

Referring to FIG. 7, the AZ pulse changes from the L level to the H level at time $t_4$, which is subsequent to the reset feed-through, and causes the comparison section $61_n$ to start the auto-zero process. Then, at time $t_5$, the AZ pulse changes from the H level to the L level so as to terminate (complete) the auto-zero process of the comparison section $61_n$.

According to the auto-zero process, with reference to a state where the VSL signal given to the comparison section $61_n$ coincides with the reference signal at time $t_5$ when the AZ pulse is at the falling edge, the comparison section $61_n$ is set so that the magnitude relationship between the VSL signal and the reference signal can be determined (compared).

FIG. 7 indicates that the auto-zero process is completed after the reset of the pixel $11_{m,n}$.

In the above case, with reference to a state where a voltage lowered by a reset feed-through portion from the VSL signal during the reset of the pixel $11_{m,n}$ coincides with the reference signal, the comparison section $61_n$ is set so that the magnitude relationship between the VSL signal and the reference signal can be determined.

As a result, the reference signal (its waveform) is such that a voltage lowered by the reset feed-through portion from the VSL signal during the reset of the pixel $11_{m,n}$, is disposed at a so-called reference position.

At time $t_6$, which is subsequent to the completion (termination) of the auto-zero process, the reference signal output section 33 (FIG. 4) increases the voltage of the reference signal by a predetermined voltage.

Increasing the voltage of the reference signal by a predetermined voltage at time $t_6$, which is subsequent to the end of the auto-zero process, is hereinafter referred to also as the start offset.

Further, for the AD conversion of the VSL signal, the reference signal output section 33 gradually decreases the voltage (level) of the reference signal at a constant rate. A portion of the reference signal whose voltage gradually decreases at a constant rate is referred to also as the slope.

At time $t_6$, the reference signal output section 33 performs the start offset by offsetting the reference signal in a direction opposite to the direction of the slope (the direction in which the voltage of the reference signal changes) by the predetermined voltage.

Subsequently, the reference signal output section 33 gradually decreases (lowers) the voltage of the reference signal at a constant rate during a fixed period between time $t_7$ and time $t_9$.

Consequently, the reference signal during the period between time $t_7$ and time $t_9$ forms the slope.

The slope of the reference signal during the period between time $t_7$ and time $t_9$ is for the AD conversion of the reset level of the VSL signal (the VSL signal immediately after the reset of the pixel $11_{m,n}$ (the VSL signal after the reset of the pixel $11_{m,n}$ and a voltage drop caused by the reset feed-through)). The period of such a slope (the period between time $t_7$ and time $t_9$) is referred to also as the P-phase (Preset phase). Further, the slope of the P-phase is referred to also as the P-phase slope.

Here, the comparison section $61_n$ is set by the auto-zero process performed after the reset of the pixel $11_{m,n}$ so that the VSL signal during the auto-zero process coincides with the reference signal (its voltage).

Therefore, according to the start offset, which increases the voltage of the reference signal by the predetermined voltage at time $t_6$ subsequent to the end of the auto-zero process, the voltage of the reference signal is higher than the voltage of the VSL signal (reset level). Thus, at the P-phase start time $t_7$, the comparator 73 in the comparison section $61_n$ outputs a comparison result indicating that the reference signal is greater than the VSL signal.

More specifically, the comparator output VOUT of the comparator 73 is at the H level.

The counter $62_n$ in the ADC $31_n$ (FIG. 4) starts counting the clock, for example, at the P-phase slope start time $t_7$.

In the P-phase, the reference signal (its voltage) decreases. Referring to FIG. 7, the reference signal and the VSL signal acting as the reset level coincide with each other at time $t_8$ in the P-phase, and the magnitude relationship between the reference signal and the VSL signal starts inverting at the beginning of the P-phase.

As a result, the comparator output VOUT of the comparator 73 in the comparison section $61_n$ starts inverting at the beginning of the P-phase, and the comparator 73 in the comparison section $61_n$ begins to output a comparison result indicating that the VSL signal acting as the reset level is greater than the reference signal.

That is, the comparator output VOUT of the comparator 73 is at the L level.

When the comparator output VOUT of the comparator 73 and thus the comparison result outputted from the comparison section $61_n$ inverts, the counter $62_n$ in the ADC $31_n$ (FIG. 4) terminates the counting of the clock. Then, the count reached by the counter $62_n$ is regarded as the AD conversion result of the reset level (reset level AD value).

After the end of the P-phase, the transfer pulse TRG in the image sensor 2 is changed from the L level to the H level during the period between time $t_{10}$ and time $t_{11}$. As a result, in the pixel $11_{m,n}$ (FIG. 3), an electrical charge applied to the PD 51 by photoelectric conversion is transferred through the transfer Tr 52 and applied to the FD 53.

When the electrical charge is applied from the PD 51 to the FD 53, the voltage of the VSL signal corresponding to the electrical charge applied to the FD 53 decreases. When the transfer pulse TRG changes from the H level to the L level at time $t_{11}$, the transfer of the electrical charge from the PD 51 to the FD 53 terminates so that the signal level (voltage) of the VSL signal corresponds to the electrical charge applied to the FD 53.

Further, after the end of the P-phase, the reference signal output section 33 (FIG. 4) increases the voltage of the reference signal, for example, to the same voltage as at the beginning of the P-phase.

As described above, when the voltage of the VSL signal corresponds to the electrical charge applied to the FD 53 or when the voltage of the reference signal increases to the same voltage as at the beginning of the P-phase, the magnitude relationship between the reference signal and the VSL signal inverts again.

As a result, the comparator output VOUT of the comparator 73 is at the H level.

After increasing the voltage of the reference signal to the same voltage as at the beginning of the P-phase, the reference signal output section 33 (FIG. 4) gradually decreases (lowers) the voltage of the reference signal, for example, at the same change rate as in the P-phase during a fixed period between time $t_{12}$ and time $t_{14}$ (this fixed period need not be the same as the fixed period between time $t_7$ and time $t_9$).

Consequently, the reference signal during the period between time $t_{12}$ and time $t_{14}$ forms a slope, as is the case with the reference signal during the period between time $t_7$ and time $t_9$.

The slope of the reference signal during the period between time $t_{12}$ and time $t_{14}$ is for AD conversion of the signal level of the VSL signal (the VSL signal prevailing immediately after the electrical charge transfer from the PD 51 to the FD 53 in the pixel $11_{m,n}$ (FIG. 3)). The period of this slope (the period between time $t_{12}$ and time $t_{14}$) is hereinafter referred to also as the D-phase (Data phase). Further, the slope in the D-phase is hereinafter referred to also as the D-phase slope.

Here, at time $t_{12}$, which is the beginning of the D-phase, the voltage of the reference signal is higher than the voltage of the VSL signal, as is the case with time $t_7$, which is the beginning of the P-phase. Therefore, at time $t_{12}$, which is the beginning of the D-phase, the comparator output VOUT of the comparator 73 is at the H level indicating that the reference signal is greater than the VSL signal.

The counter $62_n$ in the ADC $31_n$ (FIG. 4) starts counting the clock at time $t_{12}$, which is the beginning of the D-phase slope.

In the D-phase, the reference signal (its voltage) gradually decreases. Referring to FIG. 7, at time $t_{13}$ of the D-phase, the reference signal and the VSL signal representing the signal level coincide with each other, and the magnitude relationship between the reference signal and the VSL signal starts inverting at the beginning of the D-phase.

As a result, the comparator output VOUT of the comparison circuit 73 in the comparison section $61_n$ also starts inverting at the beginning of the D-phase, and is at the L level indicating that the VSL signal representing the signal level is greater than the reference signal.

When the comparator output VOUT inverts to the L level, the counter $62_n$ in the ADC $31_n$ (FIG. 4) terminates the counting of the clock. Then, the count reached by the counter $62_n$ is regarded as the AD conversion result of the signal level (signal level AD value).

When, as described above, the reset level AD value is determined in the P-phase and the signal level AD value is determined in the D-phase, the image sensor 2 performs CDS to determine the difference between the reset level AD value and the signal level AD value, and outputs the difference determined by CDS as a pixel value.

Incidentally, as the capacitor 74 is connected to the output terminal OUT1 of the comparator 73 as described with reference to FIG. 5, the comparison section $61_n$ is able to suppress noise by limiting the frequency band of a signal.

However, in a case where the capacitor 74 is connected to the output terminal OUT1 of the comparator 73, the response time in the comparison section $61_n$ may increase to decrease the frame rate of the image sensor 2.

Meanwhile, the response time can be decreased by increasing the bias current $I_A$ to be supplied to the comparator 73.

However, power consumption increases in a case where a large bias current $I_A$ is constantly supplied to the comparator 73.

Under the above circumstances, the present technology provides high-speed, low-power-consumption AD conversion by exercising control to increase the bias current $I_A$ flowing in the comparator from a first current larger than 0 (zero) to a second current larger than the first current and exercising control to connect a capacitor to the output of the comparator in a certain section of the reference signal including the P-phase and the D-phase during which the reference signal changes.

<Second Exemplary Configuration of Comparison Section $61_n$>

Figure 8:
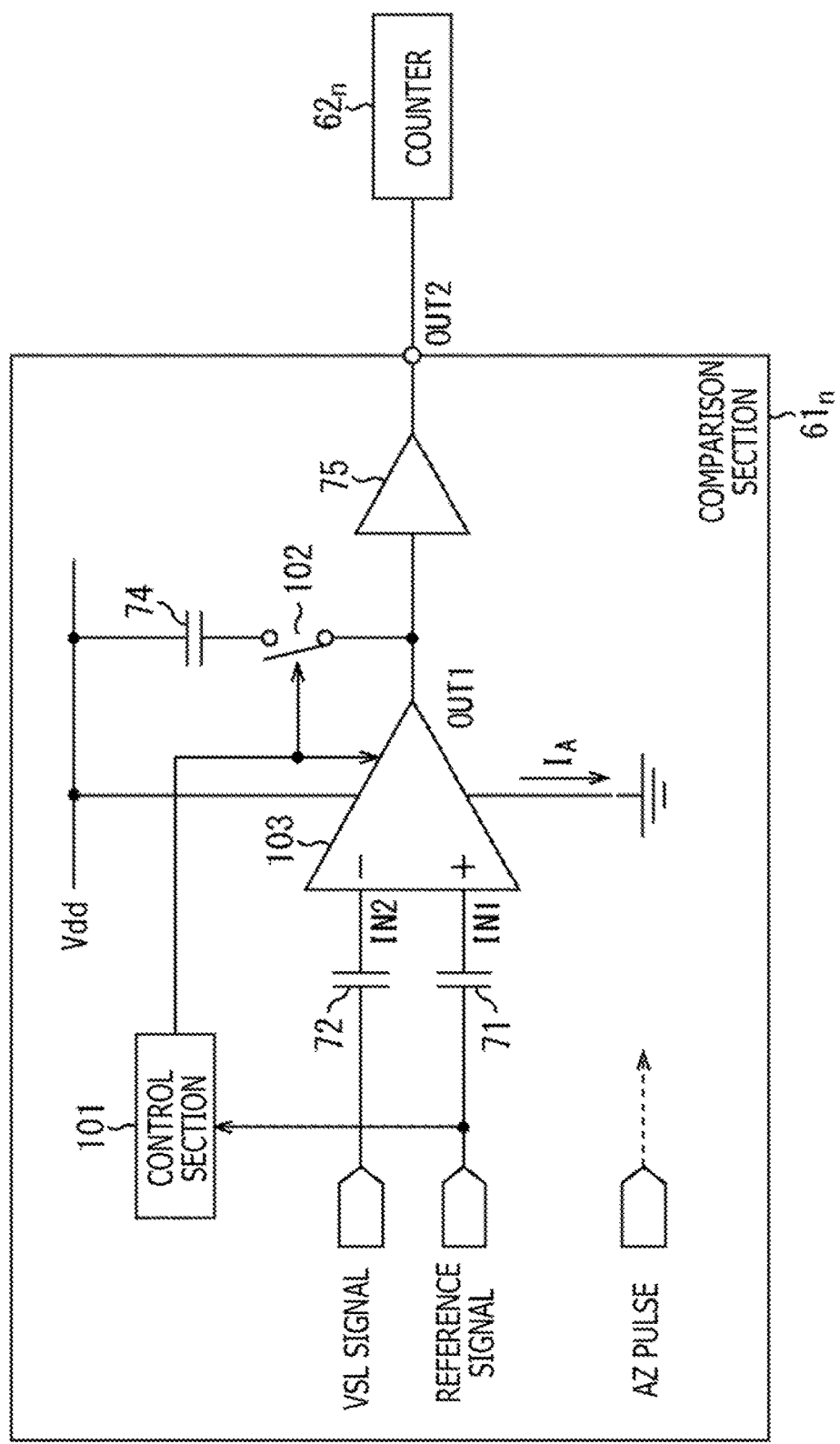
FIG. 8 is a diagram illustrating a second exemplary configuration of the comparison section $61_n$.

FIG. 8 is a diagram illustrating a second exemplary configuration of the comparison section $61_n$ depicted in FIG. 4.

It should be noted that elements corresponding to those depicted in FIG. 5 are designated in FIG. 8 by the same reference signs as their counterparts and will not be redundantly described.

Referring to FIG. 8, the comparison section $61_n$ includes capacitors 71, 72 and 74, an inverter 75, a control section 101, a switch 102, and a comparator 103.

Consequently, the comparator $61_n$ depicted in FIG. 8 is similar to the counterpart depicted in FIG. 5 in that the former includes the capacitors 71, 72 and 74 and the inverter 75.

However, the comparator $61_n$ depicted in FIG. 8 differs from the counterpart depicted in FIG. 5 in that the former additionally includes the control section 101 and the switch 102 and incorporates the comparator 103 instead of the comparator 73.

In accordance with the reference signal, the control section 101 controls the bias current $I_A$ flowing in the comparator 103 and the connection of the capacitor 74 to the output terminal OUT1 of the comparator 103.

More specifically, in a certain section of the reference signal including the P-phase and the D-phase during which the reference signal changes (hereinafter referred to also as the slope-containing section), the control section 101 turns on the switch 102 to connect the capacitor 74 to the output terminal OUT1 of the comparator 103.

Further, in the slope-containing section, the control section 101 increases the bias current $I_A$ flowing in the comparator 103 from the first current, which is larger than 0 (zero), to the second current, which is larger than the first current.

Furthermore, in a section other than the slope-containing section included in the section of the reference signal (hereinafter referred to also as the slope-free section), the control section 101 turns off the switch 102 to disconnect the capacitor 74 from the output terminal OUT1 of the comparator 103.

Moreover, in the slope-free section, the control section 101 decreases the bias current $I_A$ flowing in the comparator 103 from the second current to the first current.

Here, in the slope-free section, the bias current $I_A$ flowing in the comparator 103 can be decreased to 0 (zero) instead of being decreased to the first current, which is larger than 0 (zero). However, in a case where the bias current $I_A$ is decreased to 0 (zero), it takes a considerable amount of time for the comparator 103 to become operative when the bias current $I_A$ is increased to the second current in the subsequent slope-containing section. Accordingly, the response time increases to make it difficult to achieve high-speed AD conversion.

Meanwhile, in a case where the first current, which is larger than 0 (zero), flows as the bias current $I_A$ in the slope-free section, it is possible to avoid an increase in the response time and achieve high-speed AD conversion when the bias current $I_A$ is increased to the second current in the subsequent slope-containing section as described above.

The switch 102 is controlled by the control section 101 in order to turn on or off the connection between the capacitor 74 and the output terminal OUT1 of the comparator 103.

As is the case with the comparator 73 depicted in FIG. 5, the comparator 103 compares the VSL signal supplied to the inverting input terminal IN2 with the reference signal supplied to the non-inverting input terminal IN1, and outputs the comparator output VOUT, which indicates the result of the comparison, from the output terminal OUT1.

However, the comparator 103 has a configuration (function) that, under the control of the control section 101, makes it possible to adjust the bias current $I_A$, that is, change the bias current $I_A$, for example, to the first current or to the second current.

Although FIG. 8 indicates that the control section 101 is included in the comparison section $61_n$, the control section 101 may be disposed outside of the comparison section $61_n$ and shared by a plurality of ADCs $31_n$, that is, for example, N ADCs $31_1$ to $31_N$.

Figure 9:
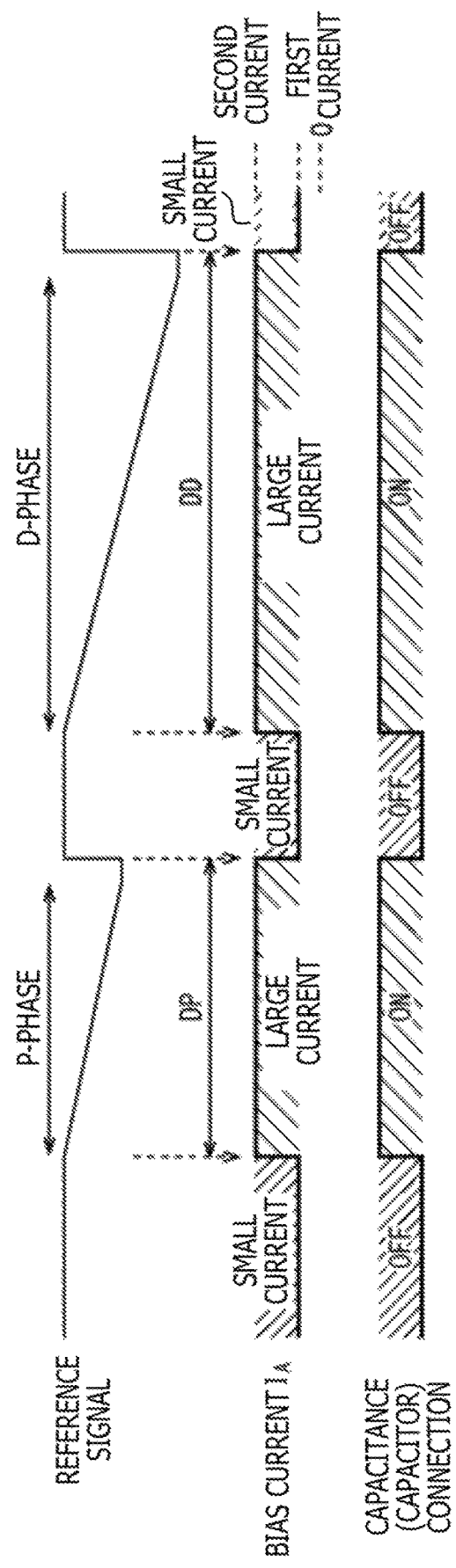
FIG. 9 is a timing diagram illustrating an exemplary operation of the comparison section $61_n$.

FIG. 9 is a timing diagram illustrating an exemplary operation of the comparison section $61_n$ depicted in FIG. 8.

Referring to FIG. 9, a section DP and a section DD are slope-containing sections in the section of the reference signal. The section DP is a section between a time point when the P-phase begins and a time point when the P-phase ends and the voltage of the reference signal increases to a voltage at the time point of the beginning of the P-phase (D-phase). The section DD is a section between a time point when the D-phase begins and a time point when the D-phase ends and the voltage of the reference signal increases to a voltage at the time point of the beginning of the D-phase (P-phase). The remaining sections are the slope-free sections.

It should be noted that, for example, the P-phase and the D-phase themselves may also be adopted as the slope-containing sections.

In slope-free sections other than the section DP and the section DD, which are slope-containing sections, the control section 101 exercises control in such a manner that the bias current $I_A$ flowing in the comparator 103 is the first current, which is larger than 0 (zero) and smaller than the second current.

Further, the control section 101 turns off the switch 102 to disconnect the capacitor 74 from the output terminal OUT1 of the comparator 103.

Meanwhile, in the sections DP and DD, which are slope-containing sections, the control section 101 exercises control in such a manner that the bias current $I_A$ flowing in the comparator 103 is equal to the second current, which is larger than the first current.

Further, the control section 101 turns on the switch 102 to connect the capacitor 74 to the output terminal OUT1 of the comparator 103.

As described above, control is exercised in the slope-free sections so that the bias current $I_A$ flowing in the comparator 103 is the first current, which is larger than 0 (zero), and control is exercised in the slope-containing sections so that the bias current $I_A$ flowing in the comparator 103 is the second current, which is larger than the first current. This makes it possible to achieve high-speed, low-power-consumption AD conversion. Eventually, the image sensor 2 featuring a high-frame rate can be implemented with low power consumption.

Further, when the capacitor 74 is disconnected from the output terminal OUT1 of the comparator 103 in the slope-free sections and connected to the output terminal OUT1 of the comparator 103 in the slope-containing sections, it is possible to achieve high-speed AD conversion and suppress noise. Eventually, a low-noise, high-frame rate image sensor 2 can be implemented.

<Exemplary Configurations of Comparator 103 Capable of Adjusting Bias Current $I_A$>

Figure 10:
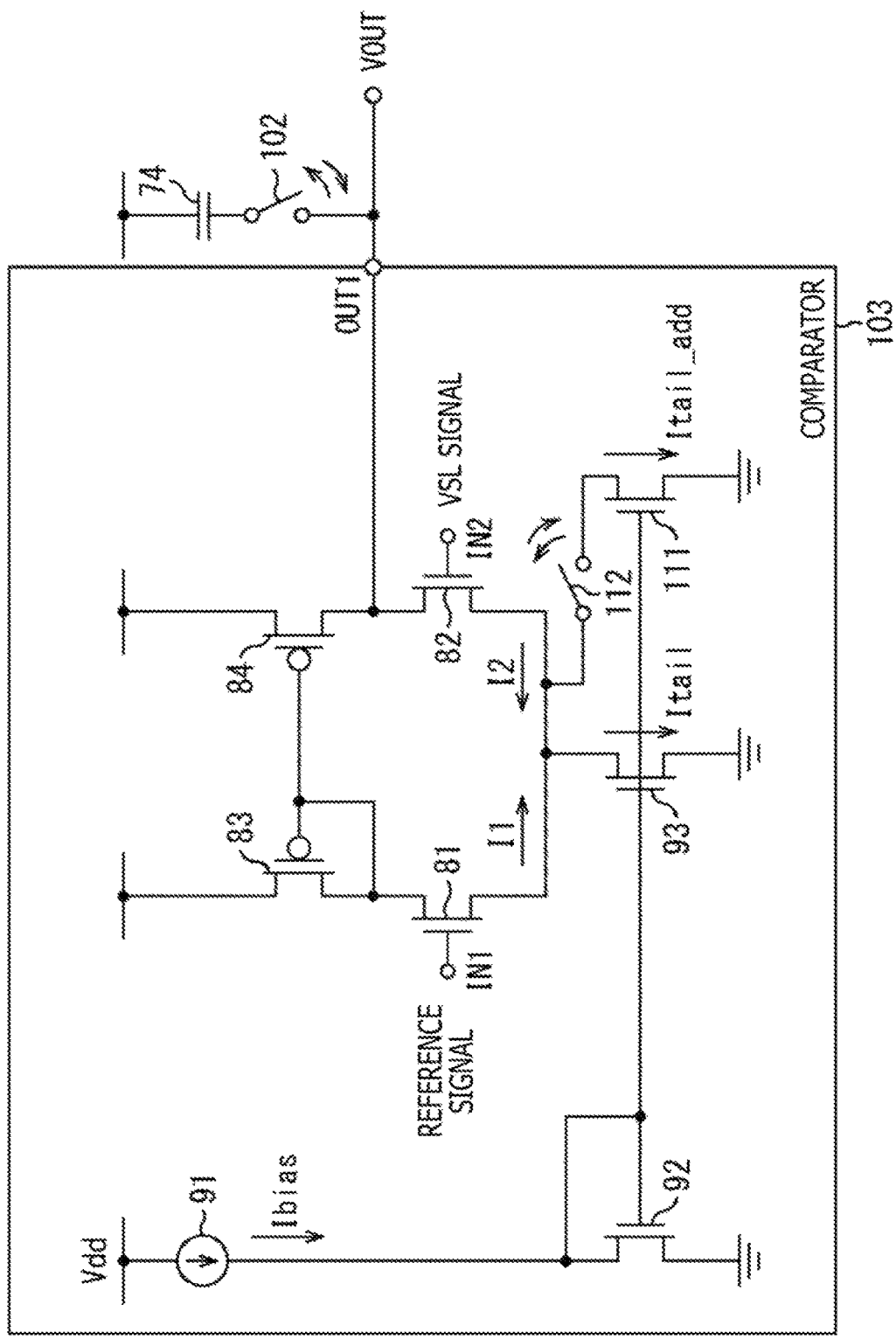
FIG. 10 is a circuit diagram illustrating a first exemplary configuration of a comparator 103 capable of adjusting a bias current $I_A$.

FIG. 10 is a circuit diagram illustrating a first exemplary configuration of the comparator 103 capable of adjusting the bias current $I_A$.

It should be noted that elements corresponding to those depicted in FIG. 6 are designated in FIG. 10 by the same reference signs as their counterparts and will not be redundantly described.

Referring to FIG. 10, the comparator 103 includes FETs 81 to 84, a current source 91, FETs 92, 93 and 111, and a switch 112.

Consequently, the comparator 103 is similar to the comparator 73 depicted in FIG. 6 in that the former includes the FETs 81 to 84, the current source 91, and the FETs 92 and 93.

However, the comparator 103 differs from the comparator 73 in that the former additionally includes the FET 111 and the switch 112.

The FET 111 is an NMOS FET that acts as a current source different from the FET 93, which also acts as a current source. The FET 111 is connected in a similar manner as the FET 93.

More specifically, the drain of the FET 111 is connected to the point of connection between the sources of the FETs 81 and 82, which form a differential pair. Such sources are connected to the GND. The gate of the FET 111 is connected to the gate of the FET 92.

Consequently, the FETs 92 and 111 respectively act as a mirror source and a mirror destination to form a current mirror. The FET 111 acts as a current source different from the FET 93, and supplies a constant current Itail_add, which is mirror-ratio-times larger than the current flowing in the FET 92.

Under the control of the control section 101 (FIG. 8), switch 112 turns on or off the connection of the drain of the FET 111 to the point of connection between the sources of the FETs 81 and 82, which form a differential pair. More specifically, the control section 101 turns on the switch 112 in the slope-containing sections in order to turn on the connection of the drain of the FET 111 to the point of connection between the sources of the FETs 81 and 82. Further, the control section 101 turns off the switch 112 in the slope-free sections in order to turn off the connection of the drain of the FET 111 to the point of connection between the sources of the FETs 81 and 82.

If, in a case where the switch 112 is off, the constant current supplied by the FET 93 is expressed as a constant current Itail, the bias current $I_A$ (=I1+I2) of the comparator 103 is the constant current Itail supplied by the FET 93.

Meanwhile, in a case where the switch 112 is on, the bias current $I_A$ of the comparator 103 is equal to the sum of the constant current Itail supplied by the FET 93 and the constant current Itail_add supplied by the FET 111.

Consequently, the first current acting as the bias current $I_A$ in the slope-free sections is equal to the constant current Itail supplied by the FET 93, and the second current acting as the bias current $I_A$ in the slope-containing sections is equal to the sum of the constant current Itail supplied by the FET 93 and the constant current Itail_add supplied by the FET 111.

Figure 11:
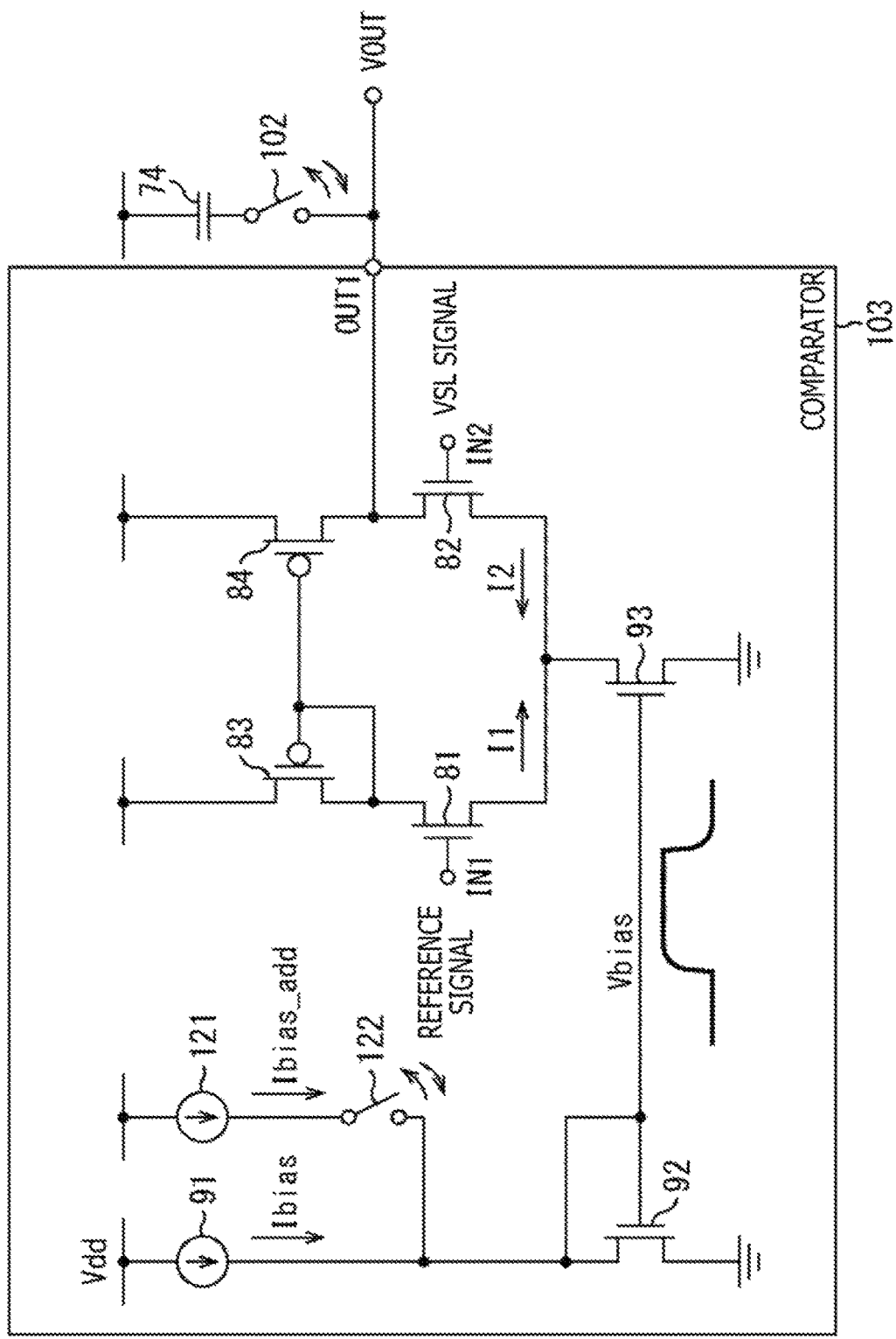
FIG. 11 is a circuit diagram illustrating a second exemplary configuration of the comparator 103 capable of adjusting the bias current $I_A$.

FIG. 11 is a circuit diagram illustrating a second exemplary configuration of the comparator 103 capable of adjusting the bias current $I_A$.

It should be noted that elements corresponding to those depicted in FIG. 6 are designated in FIG. 11 by the same reference signs as their counterparts and will not be redundantly described.

Referring to FIG. 11, the comparator 103 includes FETs 81 to 84, a current source 91, FETs 92 and 93, a current source 121, and a switch 122.

Consequently, the comparator 103 is similar to the comparator 73 depicted in FIG. 6 in that the former includes the FETs 81 to 84, the current source 91, and the FETs 92 and 93.

However, the comparator 103 differs from the comparator 73 in that the former additionally includes the current source 121 and the switch 122.

The current source 121 is connected at one end to the power supply Vdd and at the other end to the drain of the FET 92 through the switch 122 in order to supply a predetermined constant current Ibias_add.

Under the control of the control section 101 (FIG. 8), the switch 122 turns on or off the connection between the current source 121 and the drain of the FET 92. More specifically, the control section 101 turns on the switch 122 in the slope-containing sections to turn on the connection between the current source 121 and the drain of the FET 92. Further, the control section 101 turns off the switch 122 in the slope-free sections to turn off the connection between the current source 121 and the drain of the FET 92.

In a case where the switch 122 is off, the current Ibias supplied from the current source 91 flows to the FET 92, and a current mirror-ratio-times larger than the current Ibias flows to the FET 93 as the bias current $I_A$.

Further, in a case where the switch 122 is on, the sum Ibias+Ibias_add of the current Ibias supplied from the current source 91 and the current Ibias_add supplied from the current source 121 flows to the FET 92, and a current mirror-ratio-times larger than the sum Ibias+Ibias_add flows to the FET 93 as the bias current $I_A$.

That is, in the case where the switch 122 is on, the current flowing to the FET 92, which is the mirror source of a current mirror, is larger by the current Ibias_add supplied from the current source 121 than in the case where the switch 122 is off. This also increases the bias current $I_A$ to be supplied to the FET 93, which is the mirror destination.

The first current acting as the bias current $I_A$ in the slope-free sections is mirror-ratio-times larger than the constant current Ibias supplied by the FET 93, and the second current acting as the bias current $I_A$ in the slope-containing sections is mirror-ratio-times larger than the sum Ibias+Ibias_add of the current Ibias supplied from the current source 91 and the current Ibias_add supplied from the current source 121.

<Overview of Image Sensor to which Present Technology is Applicable>

Figure 12:
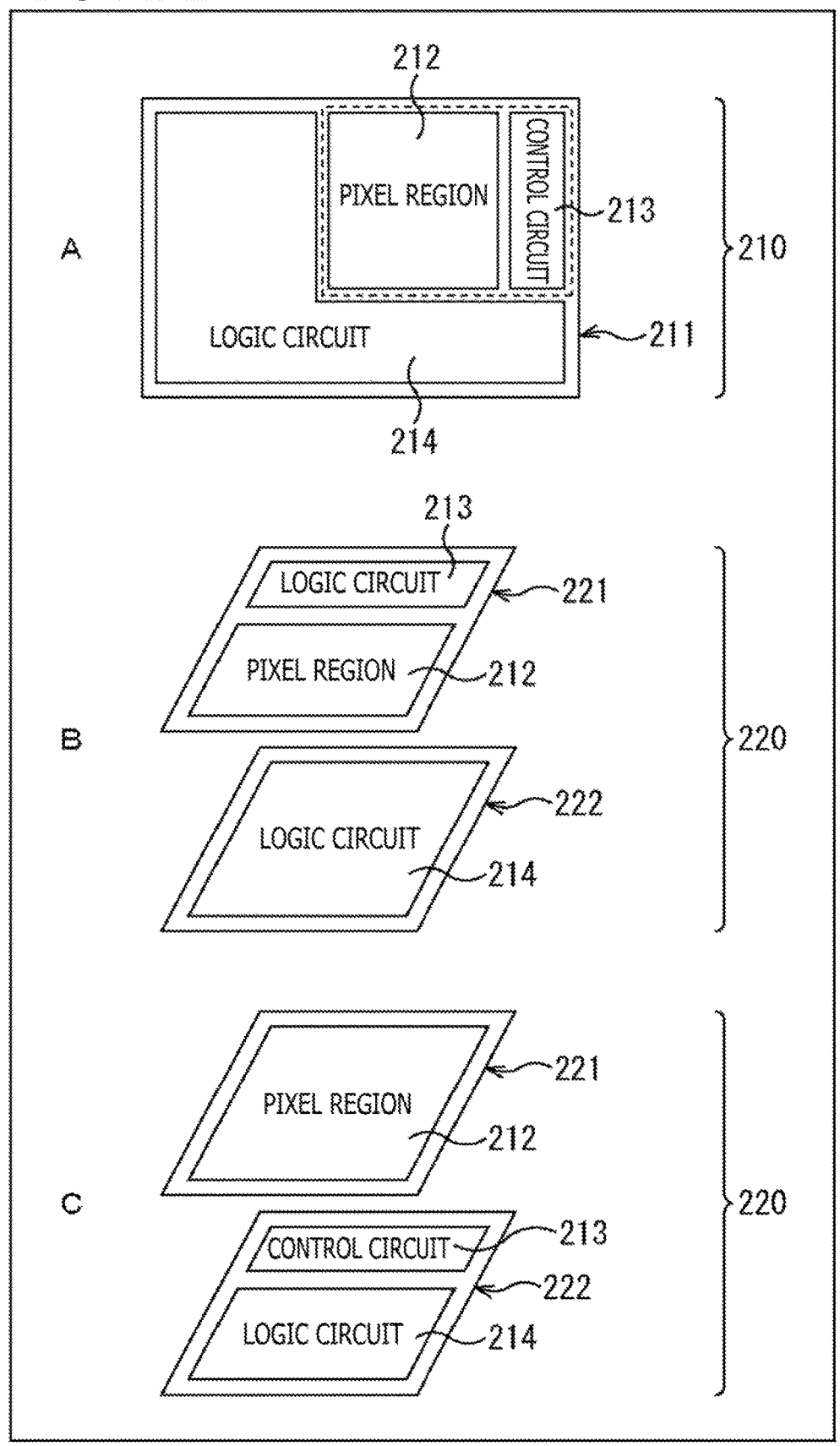
FIG. 12 depicts schematic diagrams illustrating exemplary configurations of an image sensor (solid-state imaging device) to which the present technology is applicable.

FIGS. 12A to 12C are schematic diagrams illustrating exemplary configurations of the image sensor (solid-state imaging device) to which the present technology is applicable.

FIG. 12A illustrates an exemplary schematic configuration of a single-layer image sensor. As depicted in FIG. 12A, an image sensor 210 includes a die (semiconductor substrate) 211. Mounted on the die 211 are a pixel region 212, a control circuit 213, and a logic circuit 214. In the pixel region 212, pixels are disposed in an array form. The control circuit 213 exercises various control functions including a control function for driving the pixels. The logic circuit 214 performs signal processing.

FIGS. 12B and 12C illustrate an exemplary schematic configuration of a multi-layer image sensor. As depicted in FIGS. 12B and 12C, two dies, namely a sensor die 221 and a logic die 222, are stacked on an image sensor 220. These dies are electrically connected to form a semiconductor chip.

Referring to FIG. 12B, the pixel region 212 and the control circuit 213 are mounted on the sensor die 221, and the logic circuit 214 is mounted on the logic die 222. The logic circuit 214 includes a signal processing circuit that processes signals.

Referring to FIG. 12c, the pixel region 212 is mounted on the sensor die 221, and the control circuit 213 and the logic circuit 214 are mounted on the logic die 222.

The present technology is applicable not only to a single-layer image sensor depicted, for example, in FIG. 12A, but also to a multi-layer image sensor depicted, for example, in FIGS. 12B and 12C.

Further, although FIGS. 12B and 12C depict a two-layer image sensor that is formed by stacking two dies, the present technology is applicable to an image sensor that is formed by stacking three (or more) dies.

Figure 13:
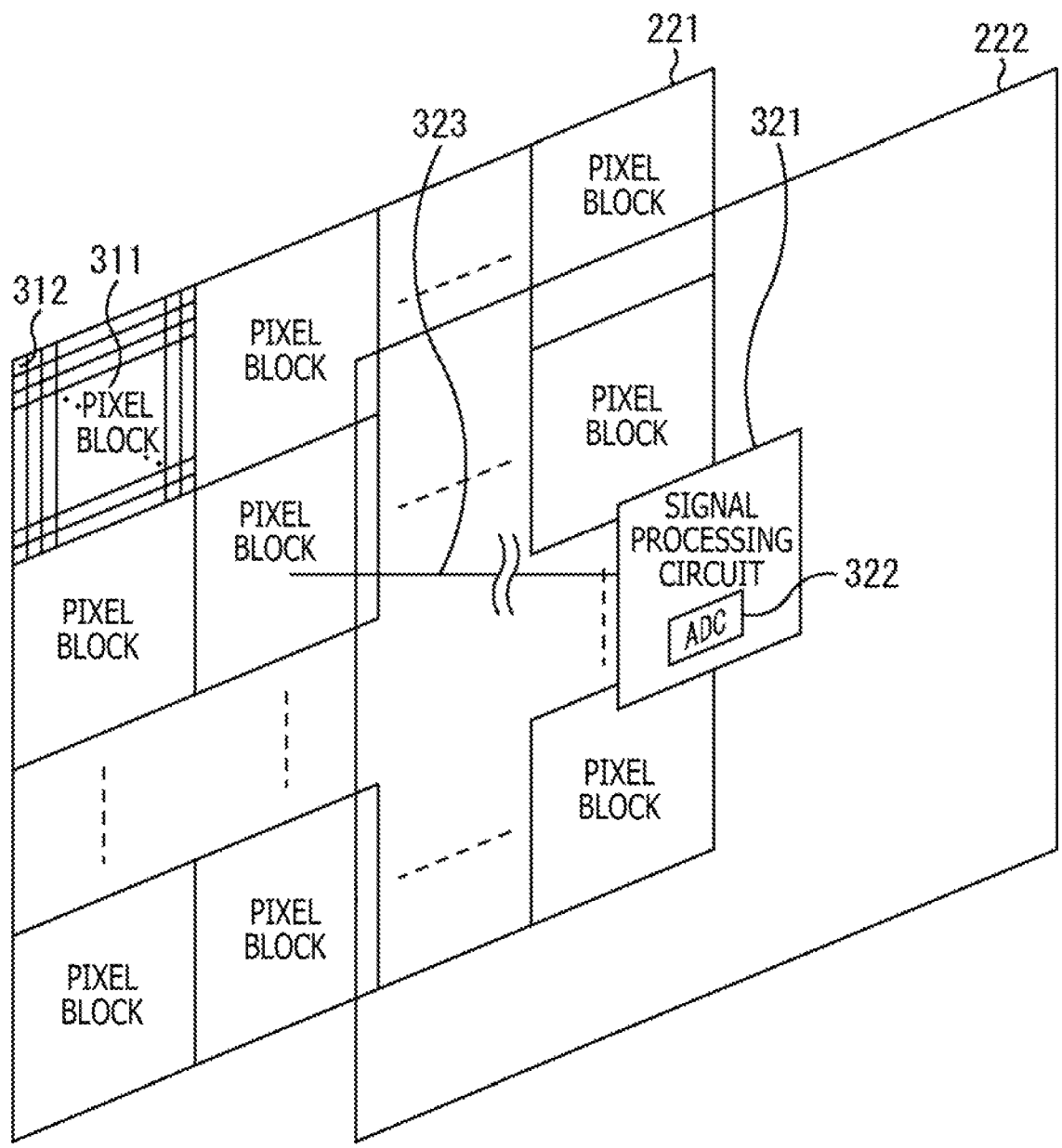
FIG. 13 is a diagram illustrating a detailed exemplary configuration of a two-layer image sensor 220 to which the present technology is applicable.

FIG. 13 is a diagram illustrating a detailed exemplary configuration of the two-layer image sensor 220 to which the present technology is applicable.

The two-layer image sensor 220 depicted in FIG. 13 is configured so that pixels 312 (in the pixel region 212) formed on the sensor die 221 are grouped into pixel blocks 311, which each include one or more pixels 312. More specifically, the sensor die 221 is divided into pixel blocks 311 in an array of X columns by Y rows (X and Y are integers of 1 or greater).

Signal processing circuits 321 are mounted on the logic die 222. The number of signal processing circuits 321 on the logic die 222 is the same as the number of pixel blocks 311. More specifically, the signal processing circuits 321 are disposed in an array of X columns by Y rows.

The signal processing circuits 321 each include an ADC 322 and a signal processing block (not depicted). The ADC 322 performs AD conversion of pixel signals that are electrical signals outputted from the pixels 312 in the pixel blocks 311 on the sensor die 221. The signal processing block performs various signal processing operations such as black level correction and development.

One signal processing circuit 321 on the logic die 222 is of similar size to one pixel block 311, and positioned so as to face one pixel block 311.

A signal processing circuit 321 processes pixel signals outputted from the pixels 312 included in a pixel block 311 that is positioned to face the signal processing block 321.

Consequently, it can be said that one pixel block 311 includes a set of pixels 312 processed by one signal processing circuit 321. Further, when it is assumed that the signal processing circuit 321 corresponds to a pixel block 311 including a set of pixels 312 subjected, for example, to signal processing by a signal processing circuit 321, it can be said that the signal processing circuit 321 on the logic die 222 is positioned to face the corresponding pixel block 311.

A signal processing circuit 321 is connected by a signal line 323 to a pixel block 311 corresponding to the signal processing circuit 321 (to a pixel block 311 positioned to face the signal processing circuit).

The pixel signals outputted from the pixels 312 in a pixel block 311 are supplied through the signal line 323 to the signal processing circuit 321 corresponding to the pixel block 311. The ADC 322 included in the signal processing circuit 321 performs AD conversion of pixel signals supplied from the pixels 312 in the corresponding pixel block 311 through the signal line 323.

The above-described AD conversion method is called an area ADC (AD conversion) method. The area ADC method is able to perform AD conversion of pixel signals in a parallel manner that covers the total number (X×Y) of signal processing circuits 321. The similar holds true for signal processing other than AD conversion.

The present technology is applicable to the ADC 322 in the image sensor 220 that adopts the above-described area ADC method.

Although FIG. 13 indicates that the ADC 322 is disposed on the logic die 222, the ADC 322 to which the present technology is applied may be mounted on the sensor die 221 instead of the logic die 222.

Further, a portion of the ADC 322 to which the present technology is applied may be mounted on the sensor die 221 while the remaining part is mounted on the logic die 222.

As regards, for example, the ADC 322 to which the present technology is applied, the FETs 81, 82, which form a differential pair of the comparator 103, may be mounted on the sensor die 221 while the remaining portion is mounted on the logic die 222.

As described above, the present technology is applicable to both the column-parallel AD conversion method depicted in FIG. 2 and the area ADC method depicted in FIG. 13.

<Exemplary Uses of Image Sensor>

Figure 14:
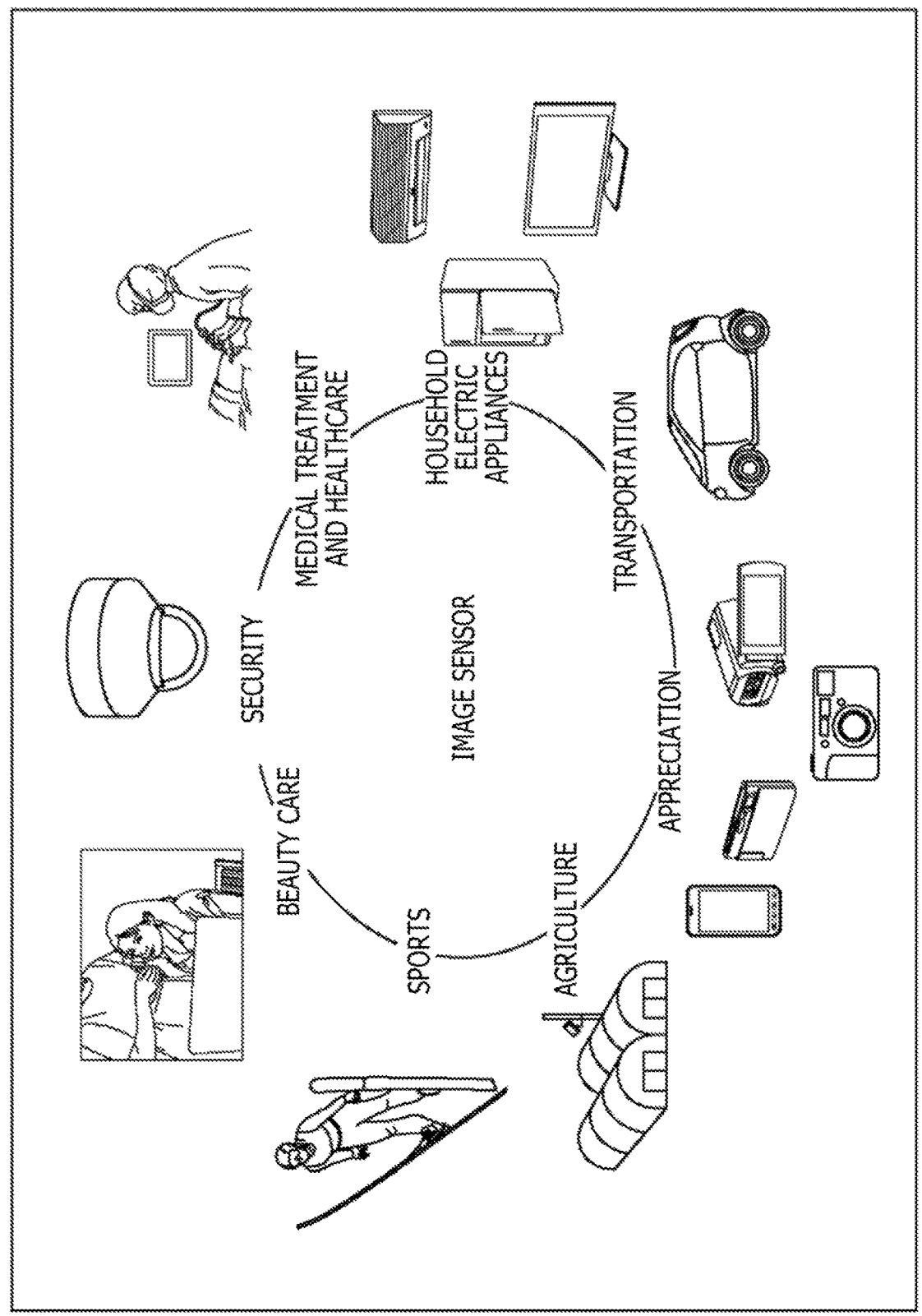
FIG. 14 is a diagram illustrating exemplary uses of the image sensor 2.

FIG. 14 is a diagram illustrating exemplary uses of the image sensor 2 depicted in FIG. 1.

The image sensor 2 can be used, for example, in various electronic apparatuses that sense visible light, infrared light, ultraviolet light, X-ray light, or other light as indicated below.

- An electronic apparatus that captures an image for appreciation, such as a digital camera or a mobile apparatus with a camera function.
- An electronic apparatus used for transportation, such as a vehicle-mounted sensor for capturing an image of, for instance, a forward or rearward view from a vehicle, a view around the vehicle, or the interior of the vehicle in order, for example, to provide an automatic stop feature and other safety driving features and recognize the status of a driver of the vehicle, a monitoring camera for monitoring traveling vehicles and roads, or a distance measuring sensor for measuring, for example, an inter-vehicle distance.
- An electronic apparatus used with a TV set, a refrigerator, an air conditioner, or other household electric appliance in order to capture an image of a user's gesture and operate the electric appliance in accordance with the gesture.
- An electronic apparatus used for medical treatment or healthcare, such as an endoscope, an electron microscope, or an angiographic instrument adapted to receive infrared light.
- An electronic apparatus used for security purposes, such as a surveillance camera for crime prevention or a camera for personal authentication.
- An electronic apparatus used for beauty care, such as a skin measuring instrument for capturing an image of skin or a microscope for capturing an image of a scalp.
- An electronic apparatus used for sports, such as an action camera or wearable camera for sporting and other events.
- An electronic apparatus used for agriculture, such as a camera for monitoring the status of farms and farm products.

Embodiments of the present technology are not limited to the foregoing embodiment. The foregoing embodiment may be variously modified without departing from the spirit and scope of the present technology.

For example, the present technology is applicable not only to an image sensor for sensing visible light rays, but also to an image sensor for sensing infrared rays and other electromagnetic rays other than the visible light rays.

Further, the present technology is applicable to AD conversion of electrical signals other than those outputted from pixels of an image sensor, that is, for example, AD conversion of analog electrical signals outputted from a microphone for sensing a sound or from a sensor for sensing some other physical quantity.

Moreover, the present technology is applicable not only to AD conversion of not only electrical signals outputted from a sensor, but also applicable to AD conversion of analog signals.

The advantages described in this document are merely described as examples. The present technology is not limited to those described advantages, and can provide additional advantages.

It should be noted that the present technology may adopt the following configurations.

<1>
An AD conversion device including:
an AD conversion section that includes a comparator for comparing an electrical signal with a variable-level reference signal, and performs AD (Analog to Digital) conversion of the electrical signal by using the result of comparison made by the comparator between the electrical signal and the reference signal; and
a control section for exercising control in such a manner that a bias current flowing in the comparator to operate the comparator during a certain section of the reference signal including a section where the reference signal changes is increased from a first current to a second current, the first current being larger than 0 (zero), the second current being larger than the first current.

<2>
The AD conversion device as described in <1>, in which the control section further exercises control in such a manner that a capacitance is connected to the output of the comparator during a certain section of the reference signal including a section where the reference signal changes.

<3>
The AD conversion device as described in <1> or <2>, in which the comparator includes a differential pair to which the electrical signal and the reference signal are inputted, and
the AD conversion device further includes a current source and an additional current source, the current source being connected to the differential pair, the additional current source being connected to the differential pair under the control of the control section.

<4>
The AD conversion device as described in <1> or <2>, in which the comparator includes a differential pair to which the electrical signal and the reference signal are inputted,
the AD conversion device further includes a current source that is a mirror destination of a current mirror and connected to the differential pair, and
the control section increases a current flowing to the current source by increasing a current flowing to a mirror source of the current mirror.

<5>
An AD conversion method including a step of:
in a case where a result of comparison made by a comparator comparing an electrical signal with a variable-level reference signal is used to perform AD (Analog to Digital) conversion of the electrical signal, exercising control in such a manner that a bias current flowing in the comparator to operate the comparator during a certain section of the reference signal including a section where the reference signal changes is increased from a first current to a second current, the first current being larger than 0 (zero), the second current being larger than the first current.

<6>
An image sensor including:
a pixel that includes a photoelectric conversion element for performing photoelectric conversion, and outputs an electrical signal;
a reference signal output section that outputs a variable-level reference signal;
an AD conversion section that includes a comparator for comparing the electrical signal outputted from the pixel with the reference signal, and performs AD (Analog to Digital) conversion of the electrical signal by using the result of comparison made by the comparator between the electrical signal and the reference signal; and
a control section that exercises control in such a manner that a bias current flowing in the comparator to operate the comparator during a certain section of the reference signal including a section where the reference signal changes is increased from a first current to a second current, the first current being larger than 0 (zero), the second current being larger than the first current.

<7>
An electronic apparatus including:
an optical system that collects light; and
an image sensor that receives light and outputs a signal corresponding to the amount of received light, in which
the image sensor includes
a pixel that includes a photoelectric conversion element for performing photoelectric conversion, and outputs an electrical signal,
a reference signal output section that outputs a variable-level reference signal,
an AD conversion section that includes a comparator for comparing the electrical signal outputted from the pixel with the reference signal, and performs AD (Analog to Digital) conversion of the electrical signal by using the result of comparison made by the comparator between the electrical signal and the reference signal, and
a control section for exercising control in such a manner that a bias current flowing in the comparator to operate the comparator during a certain section of the reference signal including a section where the reference signal changes is increased from a first current to a second current, the first current being larger than 0 (zero), the second current being larger than the first current.

REFERENCE SIGNS LIST

1 Optical system, 2 Image sensor, 3 Memory, 4 Signal processing section, 5 Output section, 6 Control section, 10 Pixel array, $11_{1,1}$ to $11_{M,N}$ Pixel, 20 Control section, 21 Pixel drive section, 22 Column-parallel AD conversion device, $31_1$ to $31_N$ ADC, 32 Auto-zero control section, 32A Auto-zero control line, 33 Reference signal output section, 33A Reference signal line, 34 Clock output section, 34A Clock line, $41_1$ to $41_M$ Pixel control line, $42_1$ to $42_N$ VSL, $43_1$ to $43_N$ Current source, 51 PD, 52 Transfer Tr, 53 FD, 54 Reset Tr, 55 Amplifier Tr, 56 Selection Tr, $61_1$ to $61_N$ Comparison section, $62_1$ to $62_N$ Counter, 71 and 72 Capacitor, 73 Comparator, 74 Capacitor, 75 Inverter, 81 to 84 FET, 91 Current source, 92 and 93 FET, 101 Control section, 102 Switch, 103 Comparator, 111 FET, 112 Switch, 121 Current source, 122 Switch, 210 Image sensor, 211 Die, 212 Pixel region, 213 Control circuit, 214 Logic circuit, 220 Image sensor, 221 Sensor die, 222 Logic die, 311 Pixel block, 312 Pixel, 321 Signal processing circuit, 322 ADC, 323 Signal line

What is claimed is:

1. An analog to digital (AD) conversion device comprising:
an AD conversion section that includes a comparator for comparing an electrical signal with a variable-level reference signal, wherein the AD conversion section performs AD conversion of the electrical signal by using a result of a comparison made by the comparator between the electrical signal and the variable-level reference signal; and a controller configured to exercise control in such a manner that a bias current flowing in the comparator to operate the comparator during a certain section of the variable-level reference signal including a section where the reference signal changes is increased from a first current to a second current, the first current being larger than 0 (zero) and the second current being larger than the first current.

2. The AD conversion device according to claim 1, wherein the controller is further configured to exercise control in such a manner that a capacitance is connected to the output of the comparator during a certain section of the reference signal including a section where the reference signal changes.

3. The AD conversion device according to claim 1, wherein the comparator includes a differential pair to which the electrical signal and the reference signal are inputted, and
   the AD conversion device further includes a current source and an additional current source, the current source being connected to the differential pair, the additional current source being connected to the differential pair under the control of the controller.

4. The AD conversion device according to claim 1, wherein the comparator includes a differential pair to which the electrical signal and the reference signal are inputted,
   the AD conversion device further includes a current source that is a mirror destination of a current mirror and connected to the differential pair, and
   the controller is configured to increase a current flowing to the current source by increasing a current flowing to a mirror source of the current mirror.

5. An analog to digital (AD) conversion method comprising a step of:
   in a case where a result of a comparison made by a comparator comparing an electrical signal with a variable-level reference signal is used to perform AD conversion of the electrical signal, exercising control in such a manner that a bias current flowing in the comparator to operate the comparator during a certain section of the variable-level reference signal including a section where the reference signal changes is increased from a first current to a second current, the first current being larger than 0 (zero) and the second current being larger than the first current.

6. An image sensor, comprising:
   a pixel that includes a photoelectric conversion element for performing photoelectric conversion and outputting an electrical signal;
   a reference signal output section that outputs a variable-level reference signal;
   an analog to digital (AD) conversion section that includes a comparator for comparing the electrical signal outputted from the pixel with the reference signal and performing AD conversion of the electrical signal by using a result of a comparison made by the comparator between the electrical signal and the reference signal; and
   a controller configured to exercise control in such a manner that a bias current flowing in the comparator to operate the comparator during a certain section of the reference signal including a section where the variable-level reference signal changes is increased from a first current to a second current, the first current being larger than 0 (zero) and the second current being larger than the first current.

7. An electronic apparatus, comprising:
   an optical system that collects light; and
   an image sensor that receives the light and outputs a signal corresponding to an amount of the light received,
   wherein the image sensor includes:
      a pixel that includes a photoelectric conversion element for performing photoelectric conversion and outputting an electrical signal,
      a reference signal output section that outputs a variable-level reference signal,
      an analog to digital (AD) conversion section that includes a comparator for comparing the electrical signal outputted from the pixel with the reference signal and performing AD conversion of the electrical signal by using a result of a comparison made by the comparator between the electrical signal and the reference signal, and
      a controller configured to exercise control in such a manner that a bias current flowing in the comparator to operate the comparator during a certain section of the variable-level reference signal including a section where the reference signal changes is increased from a first current to a second current, the first current being larger than 0 (zero) and the second current being larger than the first current.

* * * * *